United States Patent [19]

Suzuki

[11] 4,367,948

[45] Jan. 11, 1983

[54] SURFACE POTENTIAL ELECTROMETER AND IMAGE FORMING APPARATUS USING THE SAME

[75] Inventor: Koji Suzuki, Yokohama, Japan

[73] Assignee: Canon Kabushiki Kaisha, Tokyo, Japan

[21] Appl. No.: 141,885

[22] Filed: Apr. 21, 1980

[30] Foreign Application Priority Data

| | | | |
|---|---|---|---|
| Apr. 24, 1979 | [JP] | Japan | 54-51141 |
| Apr. 28, 1979 | [JP] | Japan | 54-52632 |
| Apr. 28, 1979 | [JP] | Japan | 54-52633 |
| May 8, 1979 | [JP] | Japan | 54-56536 |
| Jun. 25, 1979 | [JP] | Japan | 54-79860 |
| Jul. 10, 1979 | [JP] | Japan | 54-87118 |

[51] Int. Cl.³ .................................. G03G 15/00
[52] U.S. Cl. ........................ 355/14 D; 324/72; 355/14 CH; 324/458
[58] Field of Search ............... 355/14 D, 14 CH, 3 R, 355/3 DD, 3 CH; 324/72, 72.5, 458, 109, 118

[56] References Cited

U.S. PATENT DOCUMENTS

| | | | |
|---|---|---|---|
| 3,189,802 | 6/1965 | Zisman | 324/458 X |
| 3,852,667 | 12/1974 | Williams et al. | 324/72 |
| 3,852,668 | 12/1974 | Hardenbrook et al. | 324/72 |
| 3,898,001 | 8/1975 | Hardenbrook et al. | 324/72 X |
| 3,944,354 | 3/1976 | Benwood et al. | 324/72 X |
| 4,000,944 | 1/1977 | Fraser | 324/72 X |
| 4,003,650 | 1/1977 | Courtney et al. | 355/14 CH |
| 4,063,154 | 12/1977 | Andrus et al. | 324/72 X |
| 4,106,869 | 8/1978 | Buchheit | 324/72 X |
| 4,205,267 | 5/1980 | Williams | 324/458 |

FOREIGN PATENT DOCUMENTS 2039101 7/1980 United Kingdom ......... 355/14 CH

*Primary Examiner*—R. L. Moses
*Attorney, Agent, or Firm*—Fitzpatrick, Cella, Harper & Scinto

[57] ABSTRACT

The surface potential electrometer includes a reciprocating chopper, a measuring electrode on which a voltage is induced which is associated with the surface potential of a member to be measured, a shield member for shielding the measuring electrode and the chopper from electric field emanating from the member to be measured, and a driver for driving the chopper, thereby detecting the surface potential of the member in the form of an AC signal. The shield member is provided with an aperture for guiding the electric field emanating from the member to the measuring electrode.

59 Claims, 51 Drawing Figures

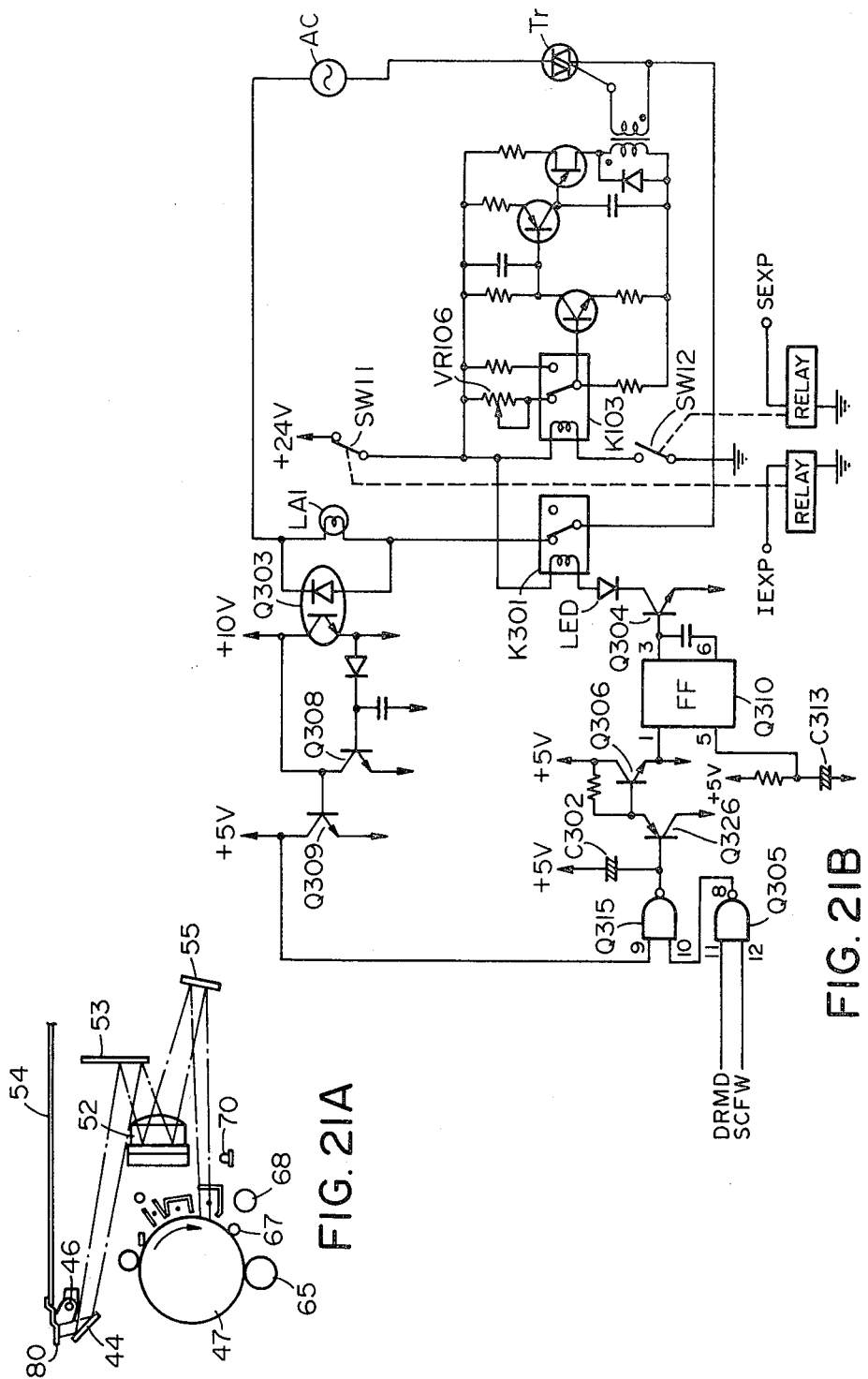

| FIG. 22A | FIG. 22B |
| FIG. 22C | FIG. 22D |

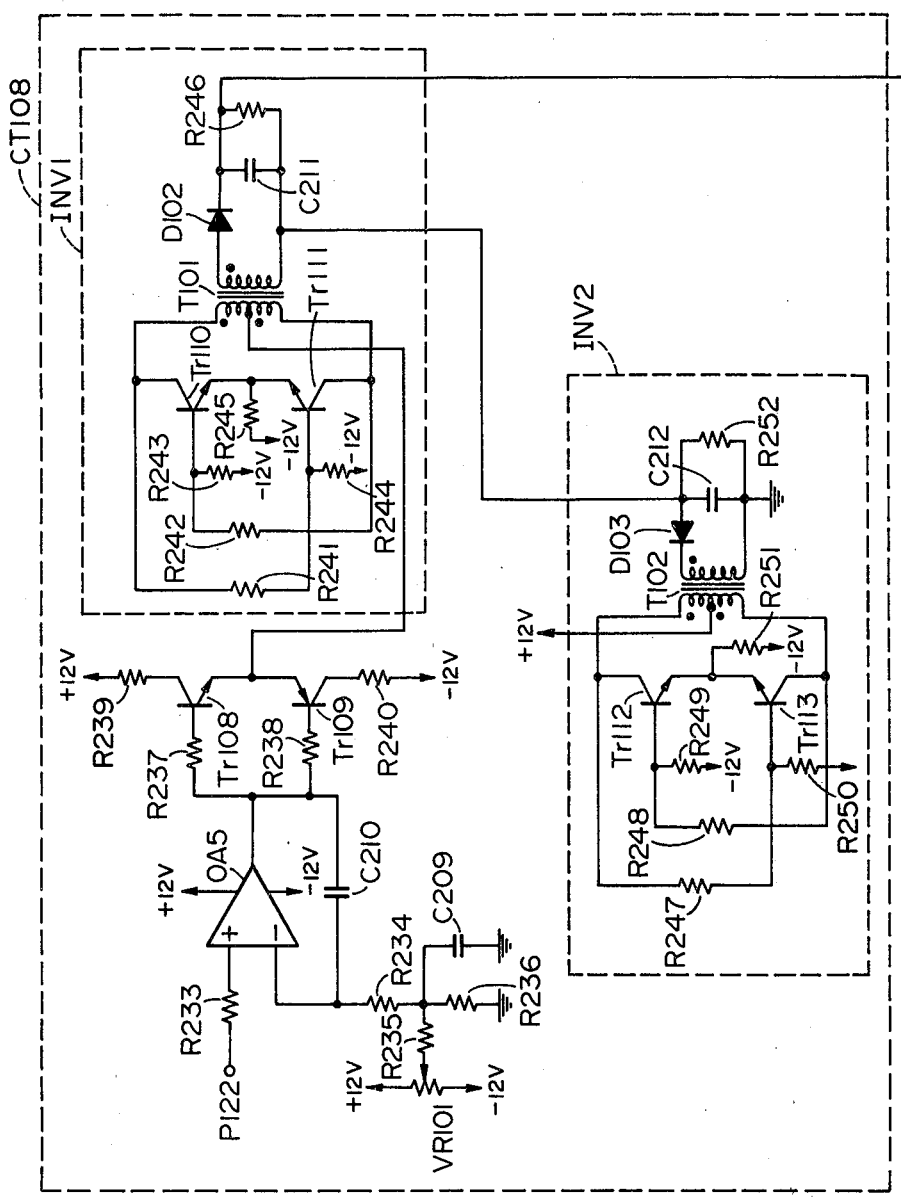
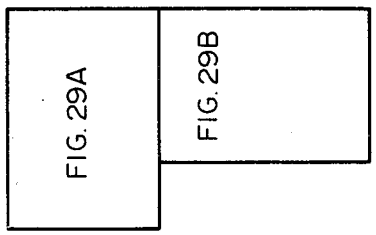
FIG. 29

SURFACE POTENTIAL ELECTROMETER AND IMAGE FORMING APPARATUS USING THE SAME

BACKGROUND OF THE INVENTION

1. Field of the Invention

The present invention relates to a surface potential electrometer for measuring the surface potential of a recording member by chopper conversion thereof into an AC current and also to an image forming apparatus such as a copier capable of controlling the image formation by means of said surface potential electrometer.

2. Description of the Prior Art

In the field of electrophotographic apparatus there is already known non-contact measurement of the surface potential of the photosensitive member for suitably controlling the process means in order to achieve stable image formation. As a method of such non-contact surface potential measurement, the present applicant already proposed, in the U.S. patent application Ser. No. 68,416, a surface potential electrometer in which a cage-shaped rotor is rotated around a detecting electrode for chopping the lines of electric force thereby detecting the surface potential as an AC signal. Such electrometer requires a motor for rotating said cage rotor, and such motor has to be small and of high precision in order to avoid the effect of motor rotation on the output signal, thus leading to a high manufacturing cost. Also such electrometer requires a high precision in the mounting in order to avoid eventual vibration of the device including the electrometer since the detection output signal is dependent on the distance between the surface to be measured and the measuring electrode or the chopping rotor.

SUMMARY OF THE INVENTION

A first object of the present invention is to provide a surface potential electrometer not associated with the aforementioned drawbacks and allowing high precision potential detection with a compact size.

A second object of the present invention is to provide an image forming apparatus capable of stable image formation through the use of a small, highly precise surface potential electrometer.

A third object of the present invention is to provide a surface potential electrometer having a tuning-fork vibrator and a measuring electrode in a shield member and performing potential measurement by intersecting the lines of electric force reaching the measuring electrode through an aperture in the shield member by the vibration of said tuning-fork vibrator which is effective in achieving a stable chopping frequency, lower drive power consumption, a simplified drive mechanism and a lower manufacturing cost.

A fourth object of the present invention is to provide a surface potential electrometer in which the vibration of said tuning fork is caused by a piezoelectric element of a stable drive frequency.

A fifth object of the present invention is to provide a surface potential electrometer structured as a shielded unit incorporating the chopper and the measuring electrode, said unit being mechanically and electrically rendered detachable through connector means from a member displaceably supporting a rotary recording member, thereby allowing rapid mounting of the electrometer at a predetermined position and distance from said recording member, thus allowing appropriate potential measurement even after the dismantling or servicing of the copier.

A sixth object of the present invention is to provide a surface potential electrometer in which the detected AC signal is converted into a DC signal supplied as a feedback bias voltage to the chopper, thereby providing a stable potential reading regardless of the fluctuation in the distance between the measuring electrode and the surface to be measured.

Still other objects of the present invention will be clarified from the following description of the preferred embodiments thereof.

BRIEF DESCRIPTION OF THE DRAWINGS

FIGS. 5-1 and 5-2 are perspective views of the surface potential electrometer;

FIGS. 9-1 and 9-2 are perspective views of another surface potential electrometer of the present invention;

FIG. 21A is a schematic cross-sectional view of a copier showing the method of developing bias control;

FIG. 21B is a circuit diagram showing a light control circuit for the original exposure lamp;

FIGS. 29A and 29B, when combined as shown in FIG. 29, are a detailed circuit diagram of the high-voltage amplifier CT108, attenuator CT109 and buffer amplifier CT110;

FIGS. 22A and 33B, when combined as shown in FIG. 33, are a circuit diagram of a charging voltage control circuit;

DETAILED DESCRIPTION OF THE PREFERRED EMBODIMENT

Now the embodiments of the present invention will be explained in the following order:
(1) Outline of the apparatus;
(2) Structure of the surface potential electrometer;
(3) Automatic surface-potential control system;
(4) Surface potential measuring circuit; and
(5) Detected potential processing circuit.

(1) Outline of the Apparatus

Figure 1A:
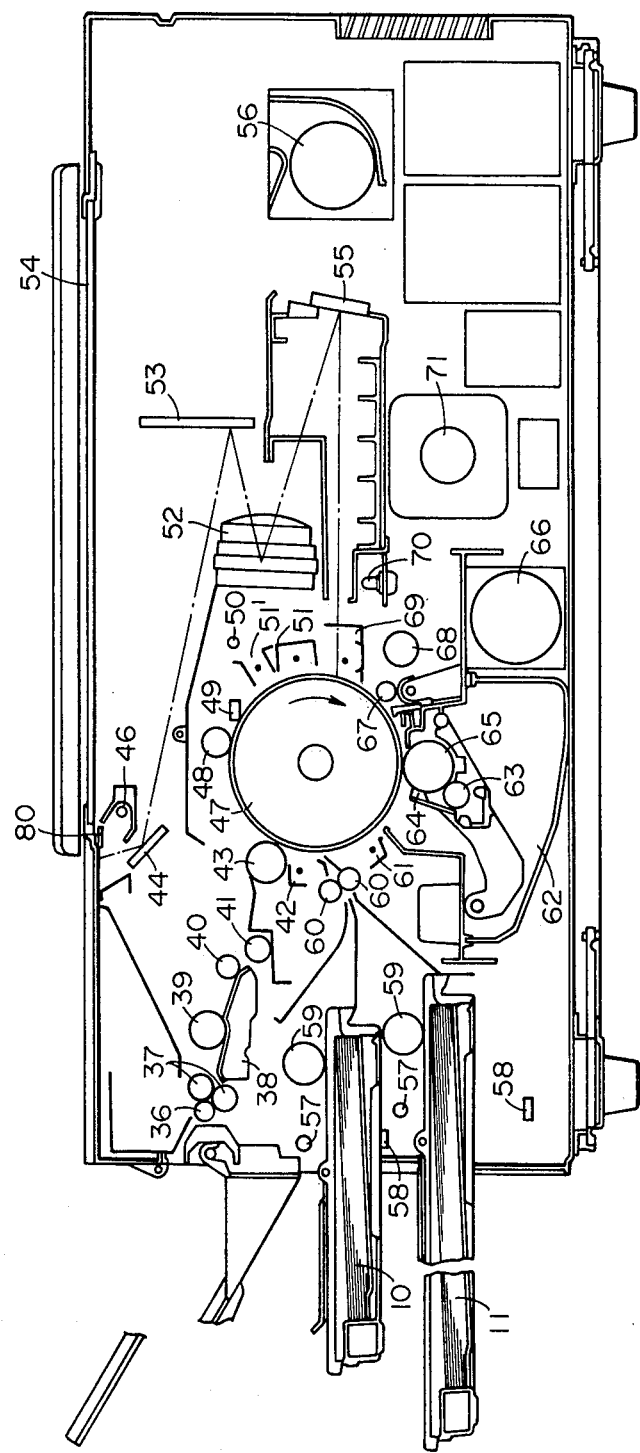
FIG. 1A is a cross-sectional view of a copier in which the present invention is applicable.

FIG. 1A is a cross-sectional view of a copier in which the present invention is applicable and in which a drum 47 provided on the periphery thereof with a three-layered seamless photosensitive member using a CdS photoconductive layer and rotatably supported on a shaft is set in rotary motion by a main motor 71 to be energized upon actuation of a copy start key.

After the rotation of the drum 47 by a predetermined angle, an original placed on an original support glass 54 is illuminated by an illuminating lamp 46 structured integrally with a first scanning mirror 44, and the reflected light is scanned by the first scanning mirror 44 and a second scanning mirrors 53. First and second scanning mirror 44 and 53 are displaced at a speed ratio of 1:½ to perform the scanning of the original while maintaining a constant optical path length in front of a lens 52.

The thus reflected light image is guided through said lens 52 and a third mirror 55 and focused onto the drum 47 in an exposure station.

The drum 47 is subjected in advance to charge elimination by means of a pre-exposure lamp 50 and an AC pre-charger 51', and is then corona charged, for example, positively, by means of a primary charger 51. Subsequently the drum 47 is subjected to slit exposure, in said exposure station, of the image illuminated by the lamp 46.

Simultaneously therewith there is conducted a charge elimination with a charge eliminator 69 by an AC corona discharge or a DC corona discharge of a polarity opposite to that of the primary corona discharge, and the drum is subsequently illuminated uniformly with a whole surface exposure lamp 18 to form an electrostatic latent image of a high contrast on said drum 47. Said latent image is developed into a visible toner image by liquid development on a developing roller 65 in the developing station 62, and said toner image is prepared for image transfer by a pretransfer charger 61.

A transfer sheet contained in an upper cassette 10 or in a lower cassette 11 is introduced into the apparatus by a paper feed roller 59 and advanced toward the photosensitive 47 at an exact timing determined by a register roller 60 in such a manner that the leading ends of the latent image and the transfer sheet mutually coincide.

Thus the toner image on the drum 47 is transferred onto the transfer sheet during passage thereof between a transfer charger 42 and the drum 47.

Upon completion of the image transfer, the transfer sheet is separated from the drum 47 by a separating roller 43, then advanced by a feed roller 41 between a hot plate 38 and pressure rollers 40, 41 in which the image is fixed by heat and pressure, and finally ejected onto a tray 34 through an ejecting roller 37 and a paper detecting roller 36.

The drum surface after the image transfer is subjected to surface cleaning in a cleaning station composed of a cleaning roller 48 and an elastic blade 49 and is forwarded to the succeeding imaging cycle.

A surface potential electrometer 67 for measuring the surface potential is positioned in the vicinity of the drum surface between the whole surface exposure lamp 18 and the developing station 62.

Prior to the above-mentioned copying cycle there is conducted a "pre-wetting" step in which liquid developer is poured onto the cleaning blade 49 while the drum 47 is still stopped after the turning on of the power supply. This step functions to remove the toner accumulated in the vicinity of the cleaning blade 49 and to lubricate the contact surface between said blade 49 and the drum 47. After the pre-wetting time of ca. 4 seconds, there is conducted a "pre-rotation" step in which the drum 47 is rotated and the pre-exposure lamp 50 and the AC precharge eliminator 51' are activated to eliminate the charge or hysteresis remaining on the drum 47. Also the drum surface is cleaned by the cleaning roller 48 and the cleaning blade 49. This step is for preparing an appropriate drum sensitivity and for preparing a clean surface for the image formation. The periods of said pre-wetting and pre-rotation are automatically varied as explained in the following according to various conditions.

Also after the completion of copying cycles of a preset number, there is conducted a "post-rotation" step LSTR in which the drum 47 is rotated several turns for charge elimination and drum cleaning by means of the AC charger 69 etc. This step is for leaving the drum 47 in an electrostatically and physically clean state.

Figure 1B:
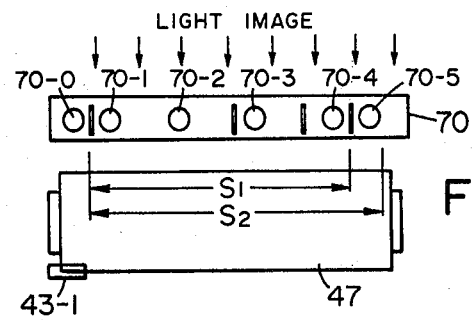
FIG. 1B is a plan view of a blank exposure lamp 70 and therearound.

FIG. 1B is a plan view of the blank exposure lamp 70 shown in FIG. 1A and the vicinity thereof, in which the blank exposure lamps 70-1 to 70-5 are lighted during drum rotation except during the image exposure for dissipating the charge on the drum, thus avoiding unnecessary toner deposition thereon.

The blank exposure lamp 70-1 for illuminating the drum surface corresponding to the surface potential electrometer 67 is however extinguished momentarily when the dark potential is measured by said surface electrometer. Also the blank exposure lamp 70-5 is lit even during the advancement of the optical system for the non-image area in case of the copying of the B5 size having a smaller image area than the A4 or A3 size. A "start cassette" lamp 70-0 is provided for illuminating a drum portion maintained in contact with a separating guide plate 43-1 to completely dissipate the charge in said area thereby preventing the toner deposition and the smear in the separating width area. Said lamp is constantly lit during the drum rotation.

Figure 2:
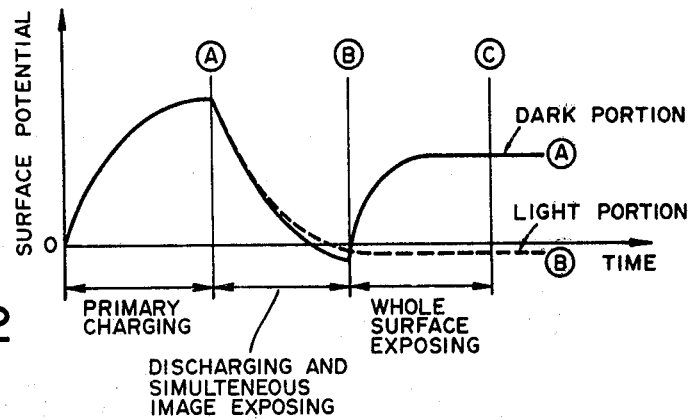
FIG. 2 is a chart showing the surface potential on various portions of the photosensitive drum.
Figure 3:
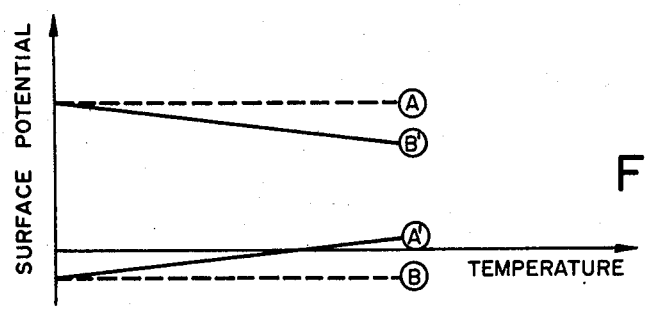
FIGS. 3 and 4 are charts showing the change in the surface potential.
Figure 4:
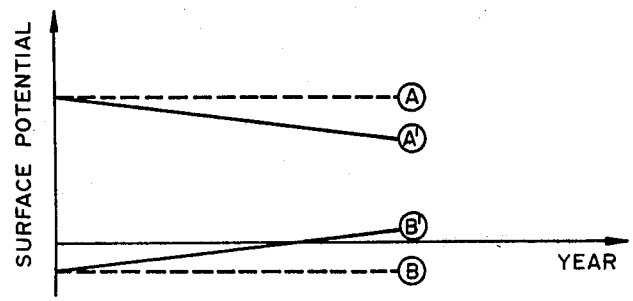

FIG. 2 shows the change in the surface potential of the photosensitive drum corresponding to a light area (with high reflection) and a dark area (with low reflection) of the original in various positions during the copying process. The final electrostatic latent image is represented by the surface potentials in the dark area (i) and in the light area (ii) which however undergo changes as shown by (i') and (ii') in FIG. 3 with the elevation of the circumferential temperature or those in FIG. 4 with the time-dependent change of the photosensitive drum 47, thus losing the contrast between the light and dark areas.

In the following there will be given an explanation of a method of compensating for such change in the surface potential resulting from such temperature-dependent or time-dependent change.

(2) Structure of Surface Potential Electrometer

Figures 1, 5:
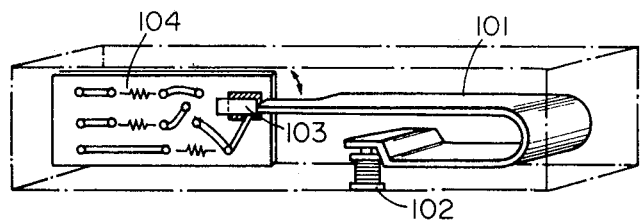
Figures 2, 5:
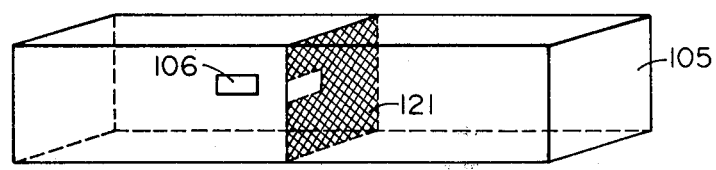

Explained first is the surface potential electrometer for detecting the surface potential. As shown in FIGS. 5-1 and 5-2 in perspective views, the surface potential electrometer of the present invention is externally covered with a metal shield member 105 for avoiding the effect of the external electric field, said shield member 105 being provided with a measuring aperture 106 which is maintained in a faced relation to the surface to be measured. Inside said shield member 105 there is provided a tuning fork member 101 in an electric condition with said shield member, said tuning fork member 101 performing self-excited vibration at a mechanical resonance frequency by means of a coil 102. At a front end of said tuning fork member there is mechanically and electrically mounted a chopper electrode 103 to perform a movement in the direction of the arrow for opening and closing said measuring aperture at regular intervals by said vibration. Behind the chopper electrode 103 there is fixedly mounted a printed circuit board 104, on which a measuring electrode 120 (FIG. 7) of the same shape as that of said measuring aperture is formed by copper foil in a faced relation to said aperture. In this manner a simpler structure is rendered possible by the use of the common printed circuit board in place of the separate electrode as in the conventional potential electrometer.

As shown in FIG. 5-2 there is further provided a shield plate 121 for preventing the effect of electric and magnetic fields from the drive coil 102 to the measuring electrode 120 and to the printed circuit board 104.

Figure 6:
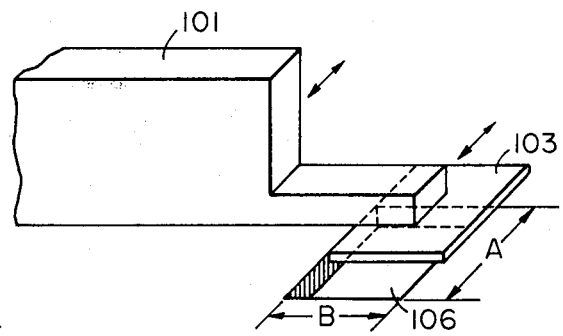
FIG. 6 is a partial perspective view of the surface potential electrometer of the present invention.

FIG. 6 shows the vicinity of said aperture 106 in a perspective view, in which A and B represent the dimensions of said aperture.

Figure 7:
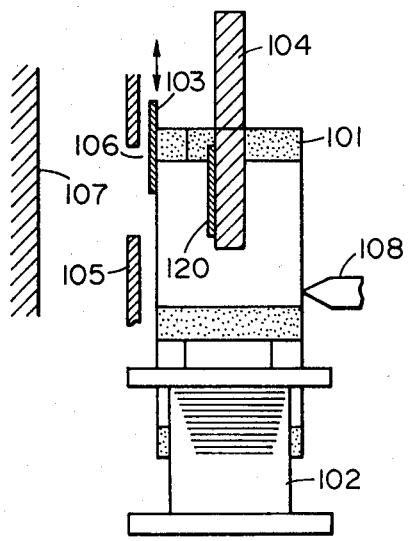
FIG. 7 is a cross-sectional view thereof.

Also FIG. 7 shows the vicinity of said aperture 106 in a cross-sectional view, in which 108 is a support member for the tuning fork member 101, and 107 is the surface to be measured.

The lines of electric force emanating from the surface charge on said surface 107 reach the measuring electrode 120 through said aperture 106 and are intersected by the chopper electrode 103 positioned therebetween and moved in the direction A by the vibration of the tuning fork member 101. In the measuring electrode, therefore, there is induced an AC voltage of an amplitude proportional to the difference between the surface potential of said surface 107 and the potential of said chopper electrode maintained at the same potential as that of the shield member. Said AC signal is converted by a current amplifying circuit composed of a source follower circuit on the printed circuit board 104 into a low impedance signal which is released as the output signal of the potential electrometer.

Figure 8:
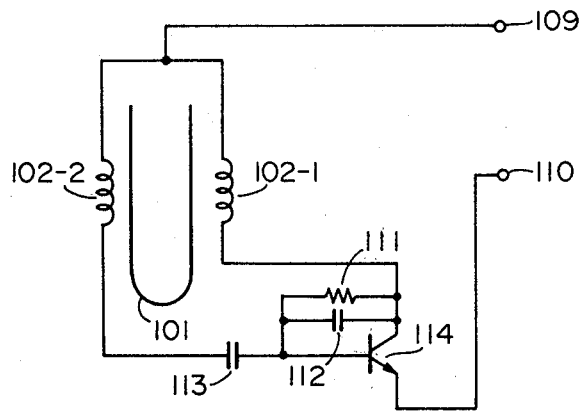
FIG. 8 is a circuit diagram for the tuning fork vibrator.

FIG. 8 shows an example of the vibrating circuit for the tuning fork 101, comprising a drive coil 102-1, a feedback coil 102-2 and elements 111–114 constituting an oscillating circuit, wherein said coils 102-1, 102-2 form a self-excited oscillating circuit of a resonance condition determined by said elements. The tuning fork 101 is vibrated by the electromagnetic function of said coils 102-1, 102-2. Terminals 109 and 110 are connected to a DC power supply.

Figures 1, 9:
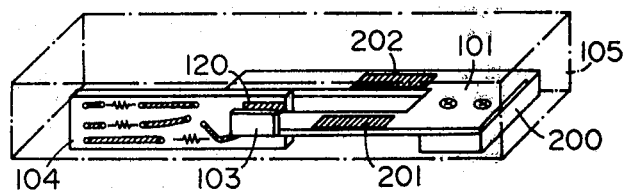
Figures 2, 9:
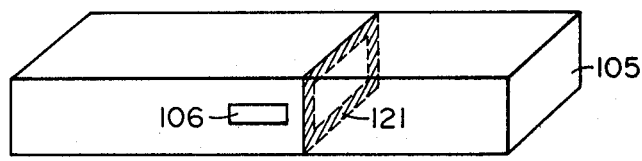
Figure 10:
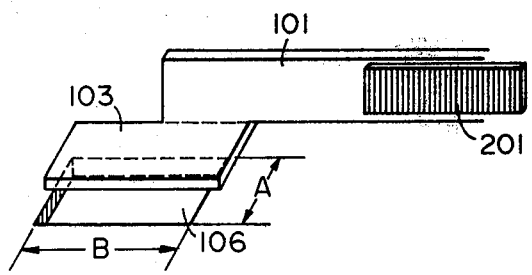
FIG. 10 is a partial cross-sectional view of the electrometer shown in FIG. 9-1.
Figure 11:
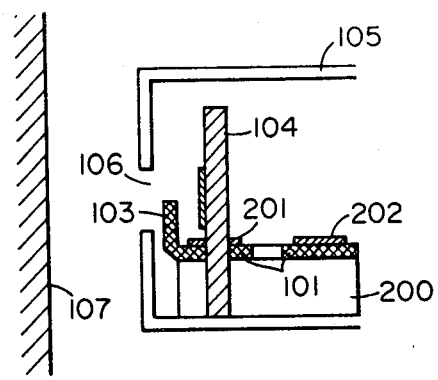
FIG. 11 is a cross-sectional view thereof.
Figure 13:
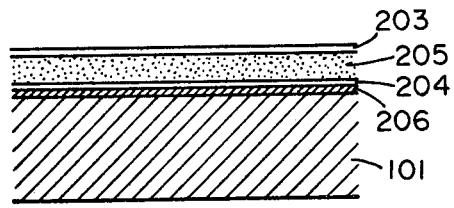
FIG. 13 is a cross-sectional view of the tuning fork vibrating member shown in FIG. 9-1.

FIGS. 9-1, 9-2, 10 and 11 illustrate another embodiment in which the tuning fork 101 is oscillated by a piezoelectric element. The vibrating member is shaped as illustrated and fixedly mounted by a support member 200. On the arms of said vibrating member there are provided piezoelectric elements 201, 202, each composed, as shown in FIG. 13, of a piezoelectric material 205 sandwiched between electrodes 203, 204 and mounted on said arm by means of a conductive adhesive. The chopper electrode 103 is formed by a bent end of the vibrating member in such a form as to cover an aperture 106. In the present embodiment said electrode is so positioned as to constantly cover one-half of the width A of the aperture 106 and to totally cover said aperture upon vibration. The area relationship of said chopper electrode 103 to said aperture 106 can be varied according to the purpose. Other components shown in FIGS. 9-11 are the same as those of corresponding numbers in FIGS. 5-7.

Figure 12:
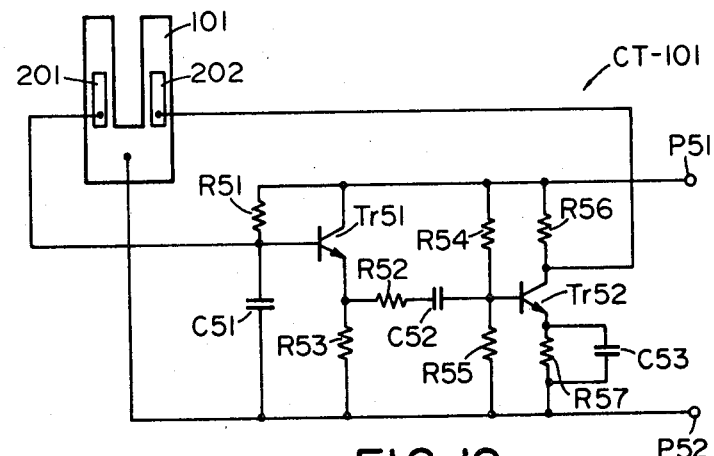
FIG. 12 is a diagram of another tuning-fork driving circuit.

An example of the drive circuit for the tuning fork utilizing piezoelectric elements is shown in FIG. 12.

In general a piezoelectric element generates a distortion in the facial direction upon receipt of an electric field in the direction of thickness thereof. The piezoelectric elements fixed by a conductive adhesive to the tuning-fork vibrating member constitute a unimorph vibrator with said tuning fork. Thus, upon application of an electric field in the direction of thickness, a lengthwise distortion is generated in the vibrating member by the form of said piezoelectric elements extended along the vibrating member.

In FIG. 12 an oscillating circuit for causing the vibration of the piezoelectric elements 201, 202 is formed by transistors Tr51, Tr52, resistors R51–R57 and condensers C51–C53, wherein the element 201 functions as a self-excited oscillating element in said circuit. The piezoelectric element 202 is connected to the collector of the transistor Tr52 while the element 201 is connected to the base of the transistor Tr51.

Upon receipt of power supply from the terminals P51, P52, the piezoelectric element 202 receives the voltage to cause mechanical vibration of the tuning fork 101, which is then converted by the piezoelectric element 201 into an electric signal generated across the thickness thereof. Said signal is supplied as a feedback signal to the input end of the drive circuit, which thus initiates oscillation at the resonance frequency of the tuning fork 101. More detailedly, the output feedback signal obtained across the piezoelectric element is current amplified by the transistor Tr51 and supplied, through the resistor R52 and the condenser C52 to the base of the succeeding transistor Tr52, in which said signal is further amplified and supplied to the piezoelectric element 202 for intensifying the vibration thereof. The feedback signal obtained from the element 201 is selected so as to constitute a positive feedback to the drive circuit, whereby the tuning fork 101 maintains the oscillation at the resonance frequency thereof in combination with the high Q value of the tuning fork.

In the present embodiment a stable surface potential detection was rendered possible at a tuning fork frequency of 300 Hz achieved in combination with the above-explained drive circuit.

Figure 14:
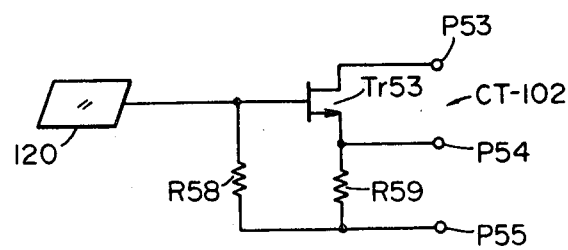
FIG. 14 is a diagram of a potential detecting circuit.

FIG. 14 shows an example of the potential detecting circuit in which a high-impedance amplifying circuit is formed by a field-effect transistor Tr53 and resistors R58, R59 for releasing an AC signal obtained by the chopping function of the tuning fork.

Figure 15:
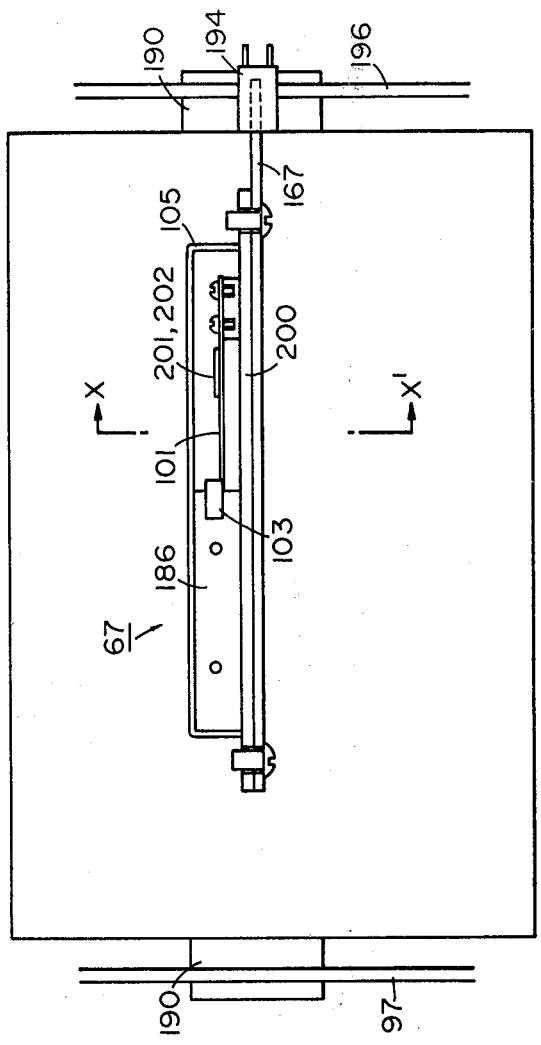
FIG. 15 is a longitudinal cross-sectional view of the potential electrometer positioned in the vicinity of the drum.
Figure 16A:
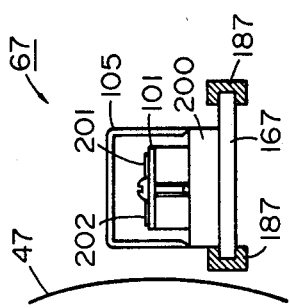
FIG. 16 is a transversal cross-sectional view of the electrometer shown in FIG. 15.
Figure 16B:
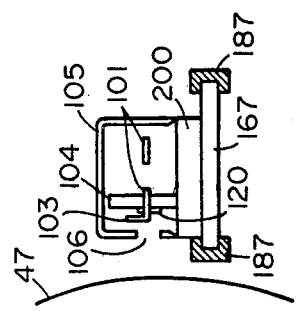

FIG. 15 is a longitudinal cross-sectional view of the surface potential electrometer utilizing a piezo-drive tuning fork positioned in the vicinity of the drum, while FIGS. 16A and 16B are cross-sectional views along the line X-X' in FIG. 15 and seen respectively from left and right.

In order to eliminate the effect of the external field, the potential electrometer is entirely covered by a metal shield member 105 and a metal support 200. The shield member 105 is provided with a measuring aperture 106, which is positioned in opposed relation to the surface to be measured. The tuning fork 101 is mounted on said support 200 in electric conduction therewith and performs a self-excited mechanical vibration at the resonance frequency thereof when a DC voltage is supplied to the drive circuit connected to the drive piezoelectric element 201 and the feedback element 202 mounted on said tuning fork.

On an arm end of said tuning fork there is mounted a measuring electrode 120 of substantially the same shape as that of said aperture 106, said electrode being insulated from said arm and positioned parallel to said aperture, whereby said measuring electrode 120 performs a reciprocating motion to open and close said aperture 106 at regular intervals in response to the vibration of the tuning fork. Behind the chopper electrode 103 there is mounted a printed circuit board 104 on which is formed, by copper foil pattern, a measuring electrode 120 of a same shape as that of said aperture 106 in opposed position thereto. Consequently said measuring electrode 120 alternately receives the lines of electric force emanating from the surface charge on the drum and those resulting from the potential of the shield member 105 to generate an AC voltage of an amplitude proportional to the difference of said two potentials.

The weak signal thus induced is supplied, after current amplification by a preamplifier provided inside the shield member, to the outside for controlling the charging and developing bias.

Figure 18:
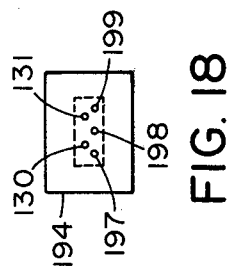
FIG. 18 is a plan view thereof.
Figure 17:
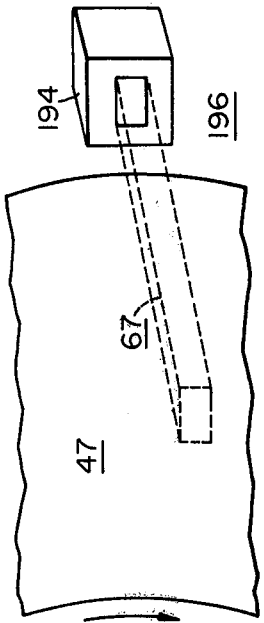
FIG. 17 is a perspective view of the connector.

In FIGS. 15-17 there are also shown a side plate 196 for rotatably supporting the shaft 190 of the drum 47 and a connector 194 mounted on said side plate 196 and detachably supporting the potential electrometer 67 through a support member 167 having printed circuits thereon, said connector also serving for the receipt of signals from said printed circuit board 104 and the supply of DC power thereto and of drive signals to the tuning fork. Said board 104 is positioned perpendicularly to said support 167 and is provided with the preamplifier circuit shown in FIG. 14 and said measuring electrode 120, both printed thereon. FIG. 18 shows the rear view of the connector 194, in which 197–199 are pins relating to the measuring electrode 120 while 130, 131 are pins for the tuning fork 101 and are connected through another connector to the external control unit and power supply.

187 is a support guide for maintaining the support 167 at a given distance from the drum surface, and functioning as rails for slidably guiding said support 167 to said connector 194, thereby facilitating the attaching and detaching of the support 167. Said guide 187 may be supported by the connector 194 or by the side plate 196.

In the conversion of the output AC signal from the potential electrometer into a DC signal corresponding to the potential of the latent image on the photosensitive drum, there is required a synchronizing signal for identifying the relative position and timing of the measuring electrode 120 with respect to the measuring aperture 106. For this purpose, in the copending U.S. patent application Ser. No. 956,330 of the present applicant the timing of chopping function is directly detected from the chopper function and is supplied to a synchronizing clamp circuit CT 106 in FIG. 23. In the chopping method of the present invention utilizing a tuning fork, however, the timing signal can be obtained by delaying, by a predetermined period, the output signal of the tuning-fork drive circuit, and in this manner it is made possible to dispense with the synchronizing line from the potential electrometer if said drive circuit is provided on an external control unit.

Also the mechanically and electrically detachable structure of the electrometer through a connector allows easy handling and permits one to easily achieve a constant distance from the photosensitive surface at the servicing.

Also as explained in the foregoing, in contrast to the electrometer for obtaining an AC signal by a rotary chopping system, the chopper drive source can be composed in a simple manner by a metal plate, a support member and coils in case of the electromagnetically driven tuning fork.

In the case of a piezo-driven tuning fork, the chopper drive source can be composed of piezoelectric elements simply adhered to the vibrating arms of the tuning fork. In this manner an extremely small electrometer can be obtained since the piezoelectric elements of a size of ca. $3 \times 10$ mm can be satisfactorily used in combination with a tuning fork of a size of ca. $10 \times 30$ mm.

Also, a high-precision potential detection can be achieved by a very stable chopping frequency determined by the mechanical specific frequency of the tuning fork.

Furthermore the vibration of the tuning fork conducted at the resonance frequency thereof allows a chopping function with a simple drive circuit and with a low power consumption, alleviating the effect of perturbation of the drive signal to the measuring electrode.

Furthermore the possibility of positioning the measuring electrode on a printed circuit board allows one to obtain a small electrometer and to obtain an AC signal faithful to the original weak signal.

Figure 19A:
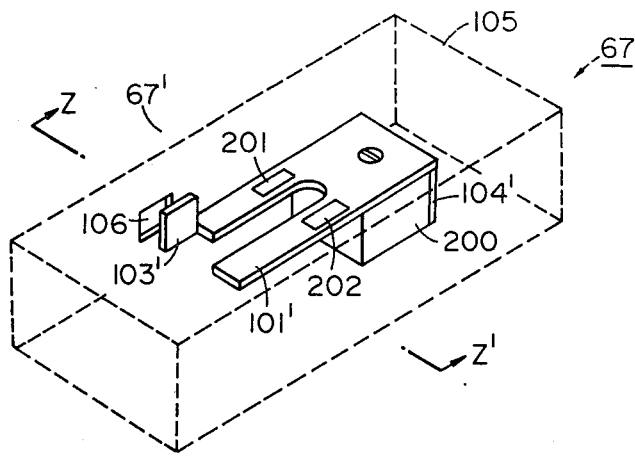
FIG. 19A is a perspective view of still another surface potential electrometer of the present invention.
Figure 19B:
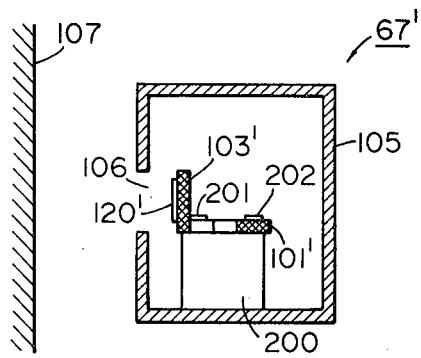
FIG. 19B is a cross-sectional view along the line Z—Z' in FIG. 19A.
Figure 19C:
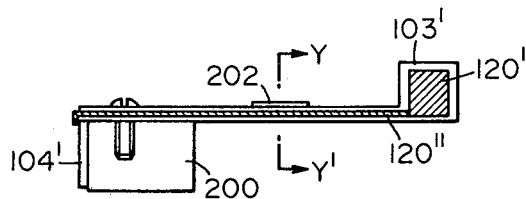
FIG. 19C is an elevation view thereof.
Figure 19D:
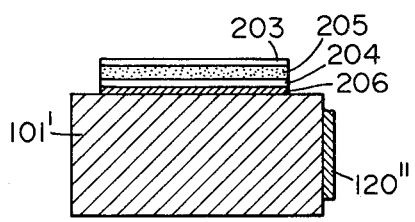
FIG. 19D is a cross-sectional view along the line Y—Y' in FIG. 19C.

Still another embodiment of the present invention is shown in FIGS. 19A, 19B, 19C and 19D, in which FIG. 19A is a transviewed perspective view of a potential electrometer 67′, FIG. 19B is a cross-sectional view along the line Z-Z' in FIG. 19A, FIG. 19C is a front view and FIG. 19D is a cross-sectional view along the line Y-Y' in FIG. 19C, wherein the components of comparable functions to those in FIGS. 10, 11 and 13 are represented by corresponding numbers. In contrast to the foregoing embodiments, the measuring electrode 120' in the present embodiment is mounted on a side facing the aperture 106 of the chopper 103' which surface is composed of an insulating material. In the present embodiment the potential detection is rendered possible since the lines of electric force from the surface 107 to the electrode 120' mounted on said chopper 103' are intersected by the conductive shield member 105 by the vibrating motion of said chopper 103'. The voltage induced on said electrode 120' is supplied, through a printed circuit board 120" mounted on an insulating side of the tuning fork 101', to a printed circuit board 104' mounted on a support member 200 and converted therein into a low-impedance signal.

Figure 23:
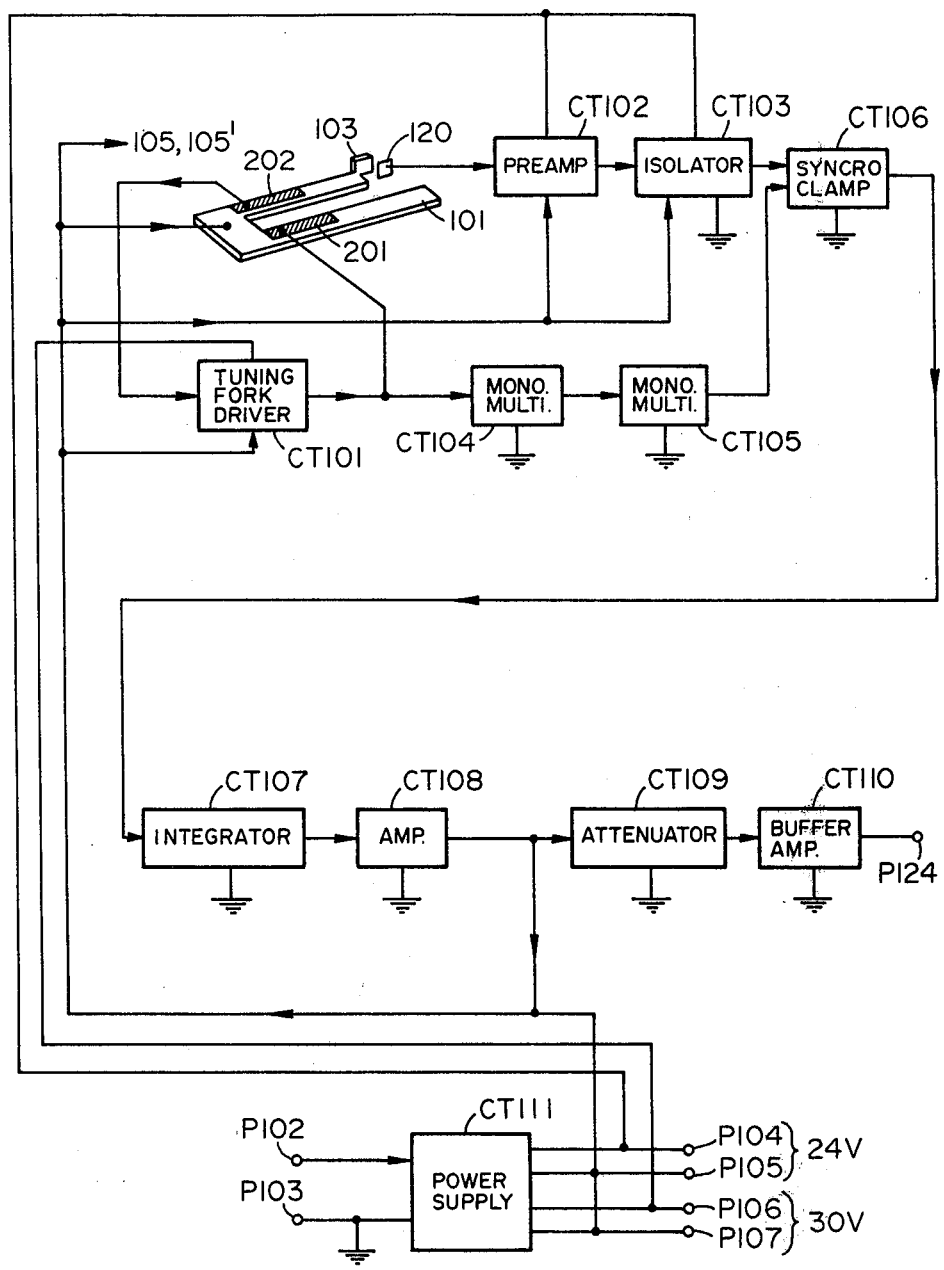
FIG. 23 is a block diagram of a surface potential measuring circuit.

A DC feedback signal $V_F$ from an amplifier 108 in a potential measuring circuit to be explained in connection with FIG. 23 is supplied not to the chopper 103' but to the shield member 105. The tuning-fork drive circuit shown in FIG. 12 can be satisfactorily utilized for this embodiment. The preamplifier can also be structured in the same manner. However the synchronizing clamp circuit CT106 shown in FIG. 23 which is designed to clamp the measured voltage $V_p$ when the chopper 103 reaches a position facing the measuring aperture 106, has to be modified so as to clamp the measured potential when the chopper 103' is in a position not facing said aperture. Such modification is easily achievable for those skilled in the art in such a manner that the monostable multivibrator CT104 obtains a pulse PLS2 at the trailing end of the pulse PLS1 instead of the leading end thereof. Such structure is applicable not only to the piezo-driven chopper of the present invention but also to the electromagnetically driven chopper.

(3) Automatic Surface-Potential Control System

In the following there will be given an explanation of an automatic surface-potential control system for use in an electrophotographic apparatus provided with a surface potential electrometer as explained in the foregoing.

In the following embodiment the surface potentials of the drum in the light and dark areas are measured by the use of the blank exposure lamp 70 in FIG. 1 instead of the illuminating lamp 46. More specifically the light and dark surface potentials are measured respectively in the drum surface areas illuminated and not illuminated by said blank exposure lamp 70.

At first there are selected target values of light potential and dark potential for obtaining a suitable image contrast. In the present embodiment the target light potential $V_{Lo}$ and the target dark potential $V_{Do}$ are respectively selected at $-100$ V and $+500$ V. As the surface potential is controlled by regulating the current to the primary charger and to the AC charger, there are determined standard currents $I_{DC1}$ and $I_{AC1}$ respectively for said positive charger and AC charger in such a manner that the light and dark potentials respectively coincide with said target potentials. In the present embodiment there were employed the following target values:

$$I_{DC1} = 350 \mu A, \quad I_{AC1} = 200 \mu A$$

The surface potential control is achieved in the following manner. At first the surface potentials $V_{L1}$ and $V_{D1}$ detected in the light and dark areas are compared with the target potentials $V_{Lo}$ and $V_{Do}$ to obtain the differences $\Delta V_{L1}$, $\Delta V_{D1}$ therefrom, i.e.:

$$\Delta V_{L1} = V_{Lo} - V_{L1} \tag{1}$$

$$\Delta V_{D1} = V_{Do} - V_{D1} \tag{2}$$

The differences in the light potential and in the dark potential are respectively compensated by the AC charger and the primary charger, but in fact the regulation of the AC charger affects not only the light potential but also the dark potential. Similarly the regulation of the primary charger affects not only the dark potential but also the light potential. For this reason there is employed a compensating system in consideration of both the AC charger and the primary charger.

The correction current $\Delta I_{DC1}$ of the primary charger is represented as follows:

$$\Delta I_{D1} = \alpha 1 \cdot \Delta V_{D1} + \alpha 2 \cdot \Delta V_{L1} \tag{3}$$

wherein $\alpha 1$ and $\alpha 2$ are set coefficients representing the change in the current of the primary charger in response to the change in the surface potentials $V_D$ and $V_L$ represented in the following manner:

$$\alpha 1 = \frac{\Delta I_{DC} \text{ (current change of primary charger)}}{\Delta V_D \text{ (change in dark potential)}} \tag{4}$$

$$\alpha 2 = \frac{\Delta I_{DC} \text{ (current change of primary charger)}}{\Delta V_L \text{ (change in light potential)}} \tag{5}$$

On the other hand the correction current $\Delta_{AC1}$ of the AC charger can be represented as follows:

$$\Delta I_{AC1} = \beta 1 \cdot \Delta V_{D1} + \beta 2 \cdot \Delta V_{L1} \tag{6}$$

wherein set coefficients $\beta 1$ and $\beta 2$ can be represented as follows:

$$\beta 1 = \frac{\Delta I_{AC} \text{ (current change of AC charger)}}{\Delta V_D \text{ (change in dark potential)}} \tag{7}$$

$$\beta 2 = \frac{\Delta I_{AC} \text{ (current change of AC charger)}}{\Delta V_L \text{ (change in light potential)}} \tag{8}$$

Consequently the currents in the positive charger and the AC charger after the first correction are represented as follows from the equations (4), (5) and (1):

$$I_{DC2} = \alpha 1 \cdot \Delta V_{D1} + \alpha 2 \cdot \Delta V_{L1} + I_{DC1} \tag{9}$$

$$I_{AC2} = \beta 1 \cdot \Delta V_{D1} + \beta 2 \cdot \Delta V_{L1} + I_{AC1} \tag{10}$$

The surface potentials do not necessarily reach the target values after the first correction since the set coefficients $\alpha 1$, $\alpha 2$, $\beta 1$ and $\oplus 2$ are selected for predetermined charging conditions such as circumferential temperature, humidity, state of corona charger, etc. which may be affected by changes in the circumferential conditions or by time-dependent deterioration of the charger. For this reason the measurement of the surface potential is conducted plural times in a predetermined condition of the apparatus, and the output control of the corona dischargers is correspondingly conducted plural times. The second correction and thereafter are conducted in a similar manner as in the first correction, so that the currents $I_{DC(n+1)}$ and $I_{AC(n+1)}$ of the positive charger and the AC charger after the n-th correction can be represented in the following manner:

$$I_{DC(n+1)} = \alpha 1 \cdot \Delta V_{Dn} + \alpha 2 \cdot \Delta V_{Ln} + I_{DCn}$$

$$I_{AC(n+1)} = \beta 1 \cdot \Delta V_{Dn} + \beta 2 \cdot \Delta V_{Ln} + I_{ACn}$$

Figure 20A:
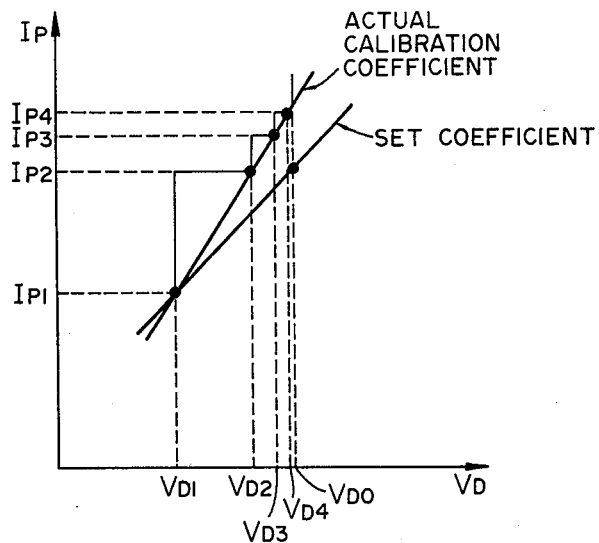
FIGS. 20A and 20B are charts showing the change in the surface potential.
Figure 20B:
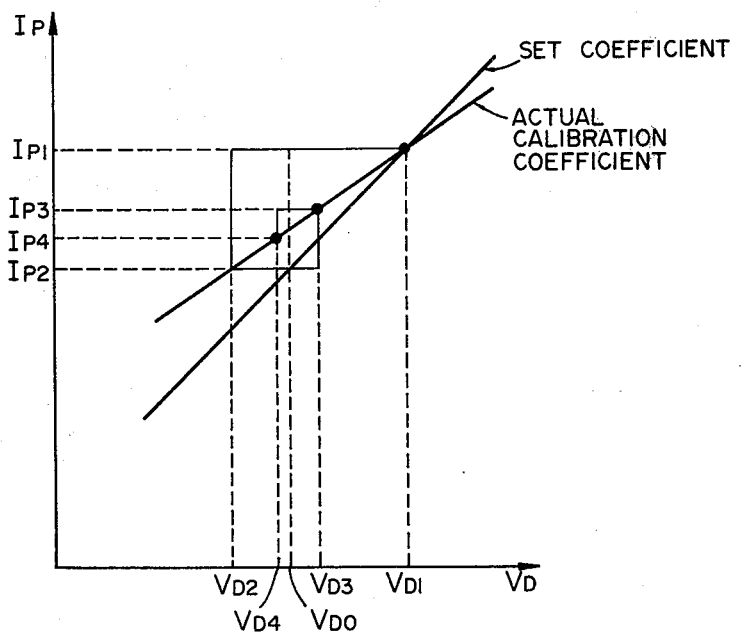

FIGS. 20A and 20B show the change in the dark potential after the third correction of the control current $I_{DC}$ of the primary charger, when the set coefficients are respectively smaller or larger than the actual coefficients.

In the present embodiment the number of corrections is selected in the following manner:

|  | State description | Corrections |
|---|---|---|
| State 1 | When copy start key is actuated within 30 seconds after the completion of the preceding copy cycle | 0 |
| State 2 | When copy start key is actuated within a period from 30 seconds to 30 minutes after the completion of the preceding copy cycle | 1 |
| State 3 | When copy start key is actuated within a period from 30 minutes to 5 hours after the completion of the preceding copy cycle | 2 |
| State 4 | When copy start key is actuated more than 5 hours after the completion of the preceding copy cycle or after the turning on of the main switch | 4 |

In this manner it is rendered possible to realize more stable surface potentials on the photosensitive member and to minimize the loss in the copying speed.

In state 1 the preceding conditions of the primary charger and the AC charger are memorized and are utilized for controlling the same in the succeeding copy cycle, while in state 2 the preceding control output current is supplied to the photosensitive member to detect the surface potentials for control.

However, in states 3 and 4, said target currents $I_{DC1}$ and $I_{AC1}$ are employed for the measurement of surface potentials for the first correction. Also in case the copying operation is not effected for a period in excess of 30 minutes, a correction is conducted for every 30-minute period.

Such function is based on the performance of the memory circuit for storing the control signals and more specifically on the fact that the memory time of the analog memory (integrating circuit shown in FIG. 31) is preferably limited to 30 minutes in order to prevent information loss. Since the memorized information may fluctuate in excess of 5% from the initial value when the memory time exceeds 30 minutes, the surface potentials are remeasured after resetting in such case.

In the present embodiment there is further controlled the developing bias voltage as explained in the following in relation to the schematic cross-sectional view shown in FIG. 21A.

Immediately prior to the original exposure, a standard white plate 80 provided close to the original supporting glass plate 54 is illuminated by the original illuminating halogen lamp 46 and the diffused reflected light is guided to the drum 47 through the mirrrors 44, 53, 55 and the lens 52. The amount of illuminating light is selected at a standard value while the amount of light in the original exposure by the displacement of the lamp 81 is changed to an amount arbitrarily selected by the operator. The surface potential electrometer 67 measures the surface potential $v_L$ in the drum area exposed to said diffused reflected light and sets the developing bias voltage at a value higher than said $v_L$ by 50 V.

Said developing bias voltage $V_H$ functions to generate an electric field constantly directed from the developing roller 65 to the photosensitive drum 47, between said roller and the light area of said drum.

The negative toner employed in the present embodiment is negatively charged by a charge controllant and thus is not deposited in the light area of the photosensitive drum 47. It is thus possible to prevent background fog formation and to ensure constantly stable image formation.

Also the present embodiment achieves stable image formation by the change of light surface potential through the exposure control even when the original background is not white but colored, since the standard white plate 80 is exposed to a standard amount of light while the actual original exposure is conducted with an amount of light arbitrarily selected by the operator.

FIG. 21B shows an example of the light control circuit for controlling the amount of light from the original exposure lamp 46. K301 is a relay normally maintained in the illustrated state and functioning to cut off the power supply to a lamp LA1 in case of an abnormality. In response to a high-level timing output signal IEXP supplied from an unrepresented DC control unit, a switch SW11 is closed to activate a triac Tr thereby lighting the lamp, at a timing shown in the timing chart of FIG. 22. For the purpose of controlling the copy density through the regulation of the amount of light from the lamp LA, there is provided a light controlling circuit for the power phase control by a triac in response to the displacement of a density control means VR106.

A relay K103 allows, in the illustrated state, a light control function by a variable resistor VR106 and selects, at the inverted state, a standard light amount equal to that obtained when the lever is positioned at the center in the light adjustment range. In response to a standard exposure signal SEXP a switch SW12 is closed to illuminate said standard white plate with said standard light amount and to select the bias voltage for the developing roller in response to the measured light potential on the photosensitive member.

The use of a standard white plate 80 illuminated by the actual exposure lamp for the determination of the developing bias voltage $V_H$ improves the precision of said bias voltage control, and such operation, being conducted immediately prior to the original exposure, does not result in the loss of copying speed. Also a stable image formation without background fog is ensured even when the original background is colored since the original exposure is effected with a light amount arbitrarily selected by the operator.

Figures 22, 22A:
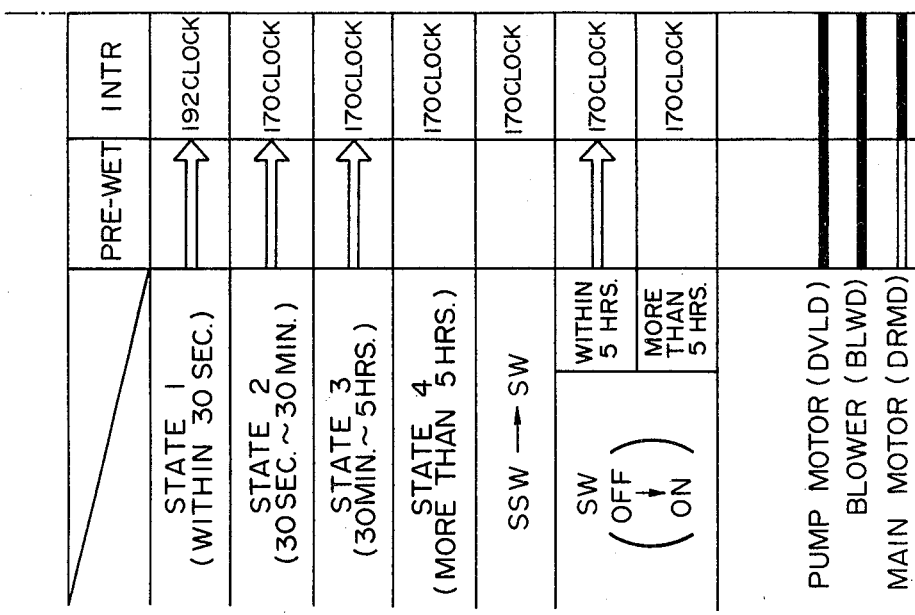
FIGS. 22A through 22D, when combined as shown in FIG. 22, are a timing chart for the image formation and the surface potential control.
Figure 22B:
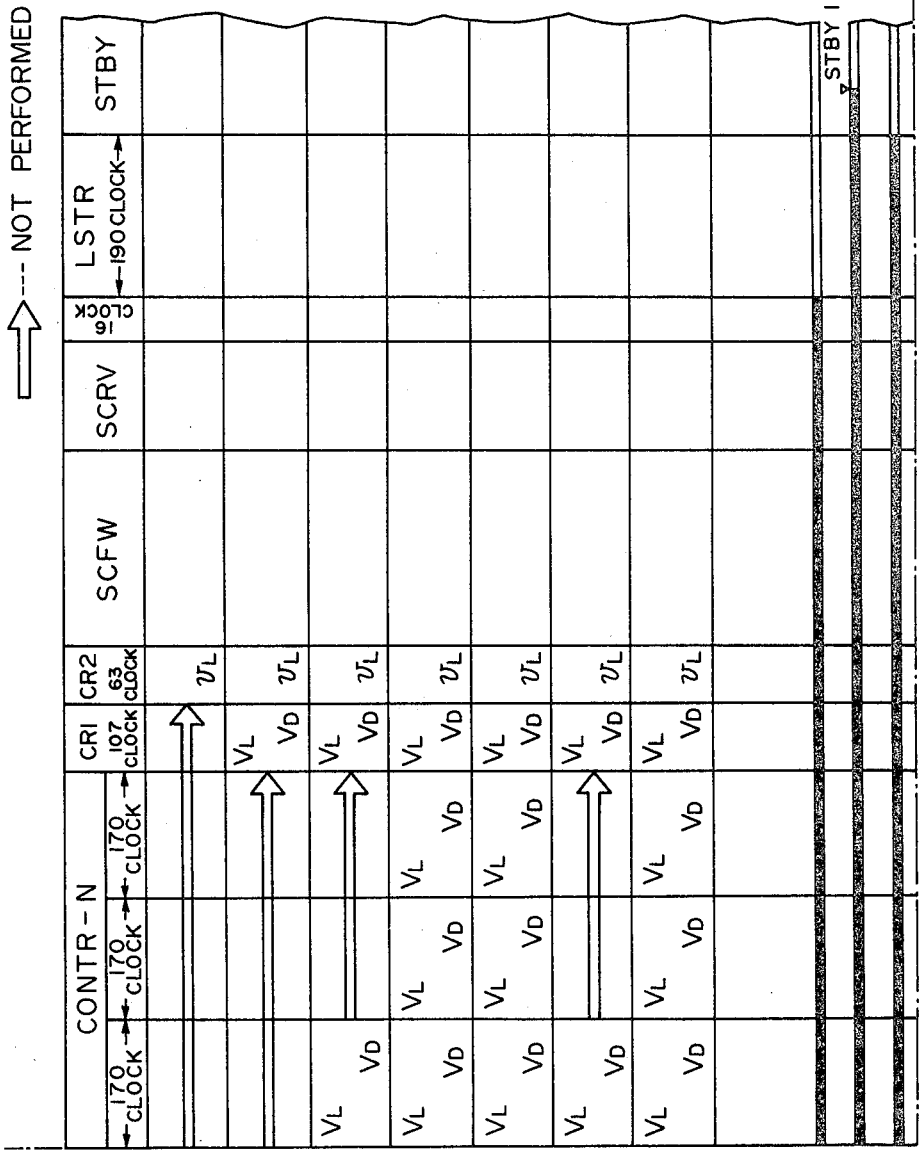
Figure 22C:
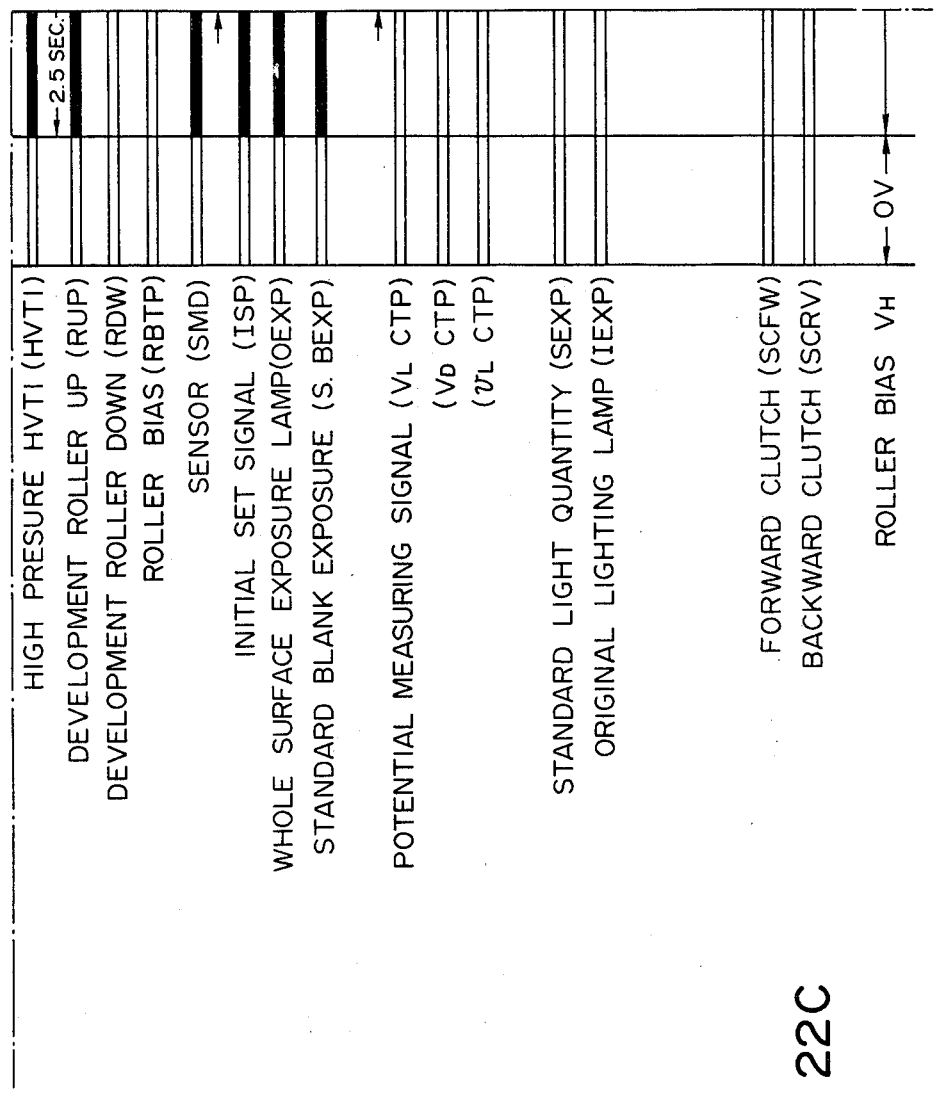
Figure 22D:
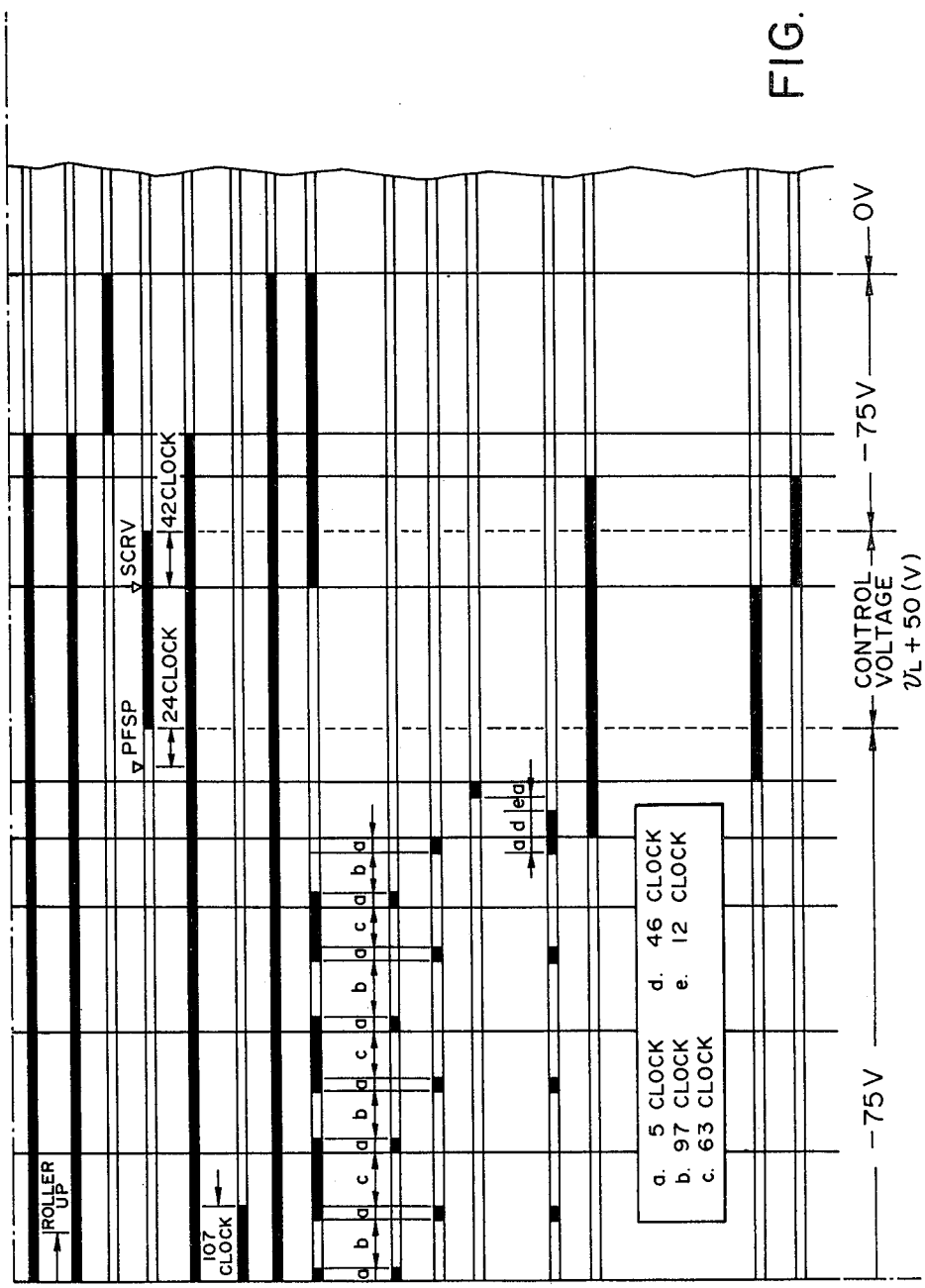

FIG. 22 is a timing chart for the above-explained image formation and surface potential control, in which a step INTR is an introductory or preliminary rotation step always conducted prior to the copying operation in order to dissipate the remaining charge on the drum thereby ensuring an appropriate sensitivity thereof. A step CONTRO-N indicates a drum rotation step for maintaining said drum at a stationary state according to the idling time, during which the light and dark potentials $V_L$, $V_D$ are alternately measured for every one rotation of the drum whereby the drum surface potentials are adjusted closer to the target potentials by means of a surface potential control circuit to be explained later. It is also possible to effect plural measurements of said potentials during each rotation of the drum.

A drum rotation step CR1 is provided for measuring the light and dark potentials and controlling the corona chargers during 0.6 turns of the drum.

A drum rotation step CR2 is provided immediately prior to the copying operation for measuring the light potential obtained with the standard light amount from the exposure lamp and thus determining the bias voltage of the developing roller. This step is always effected before starting the copying operation. A step SCFW is for drum rotation for actual copying operation involving the forward displacement of the optical system.

In the following there will be explained the circuit for achieving the surface potential control explained in the foregoing.

(4) Surface Potential Measuring Circuit

FIG. 23 shows an example of the surface potential measuring circuit, in which, in response to a sensor drive signal SMD, a tuning-fork control circuit CT101 is activated to initiate the vibration of said tuning fork 101, with the resulting vibration of said chopper 103, thus inducing, on said measuring electrode 120, an AC voltage of an amplitude proportional to the absolute value of the difference between the surface potential of the photosensitive drum 47 and the bias voltage of said chopper.

The AC signal induced on said measuring electrode 120 is amplified and converted into a DC voltage of a same polarity as that of the measured potential by means of the measuring circuit shown in FIG. 23, and is supplied as a feedback signal to the chopper 103 and the shield member 105, thus maintaining said chopper and shield member at the same potential as the potential to be measured. In this manner the chopper receives a feedback potential equal to the potential to be measured regardless of the measuring distance.

The above-explained potential feedback to the chopper and the shield member is conducted in the following manner.

Figure 25:
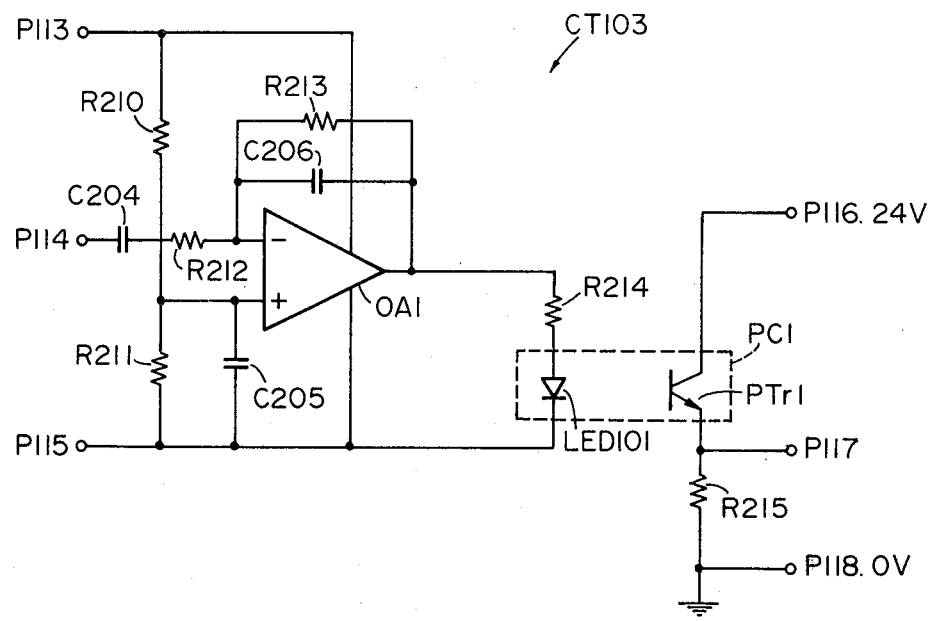
FIG. 25 is a circuit diagram for the isolator CT103.

In FIG. 23 there are shown a tuning-fork drive circuit CT101, a potential detecting preamplifier CT102 shown in FIG. 14, an isolator CT103 shown in FIG. 25, monostable multivibrators CT104, CT105, a synchronizing clamp circuit CT106, an integrating circuit CT107, a high-voltage amplifier CT108, an attenuator CT109, a buffer amplifier CT110 and a power supply circuit CT111.

Said power supply circuit CT111 is composed of a switch regulator which, in response to an input DC voltage of 24 V supplied between input terminals P102 and P103, provides two output voltages of 24 V (P104–P105) and 30 V (P106–P107) which are completely isolated from said input voltages.

The negative poles of said output voltages are both connected to the output terminal of the amplifier CT108 and thus maintained at the same potential as that of the shield member and the chopper.

The positive pole of said output voltage of 30 V is connected to the power supply terminal P51 of the tuning-fork drive circuit CT101 while that of said output voltage of 24 V is connected to the power supply terminal P53 of the preamplifier CT102 and the power supply terminal P113 of the isolator CT103.

The weak AC signal induced on the measuring electrode 120 is taken out from the potential electrometer after conversion into a low-impedance signal by the preamplifier CT102 in order to prevent the effect of external noises. The output voltage of said preamplifier is overlapped with the output potential of the amplifier CT108 with respect to the ground potential since the chopper 103 and the shield member 105 are connected to the output of said high-voltage amplifier CT108 while the power supply to said preamplifier is also biased by the output of said amplifier CT108. The isolator CT103, which is detailedly shown in FIG. 25, is provided for eliminating the overlapped output of the amplifier CT108 from the output signal of the preamplifier CT102. This is achieved by AC amplifying the output from the preamplifier with an operational amplifier OA1 is cause a change in the current of a light-emitting diode LED101 in a photocoupler PC1, and thus varying the emitter current of a phototransistor PTr1 thereby obtaining an output signal not containing the overlapped output of the amplifier CT108 at said emitter of the phototransistor PTr1.

Figure 26:
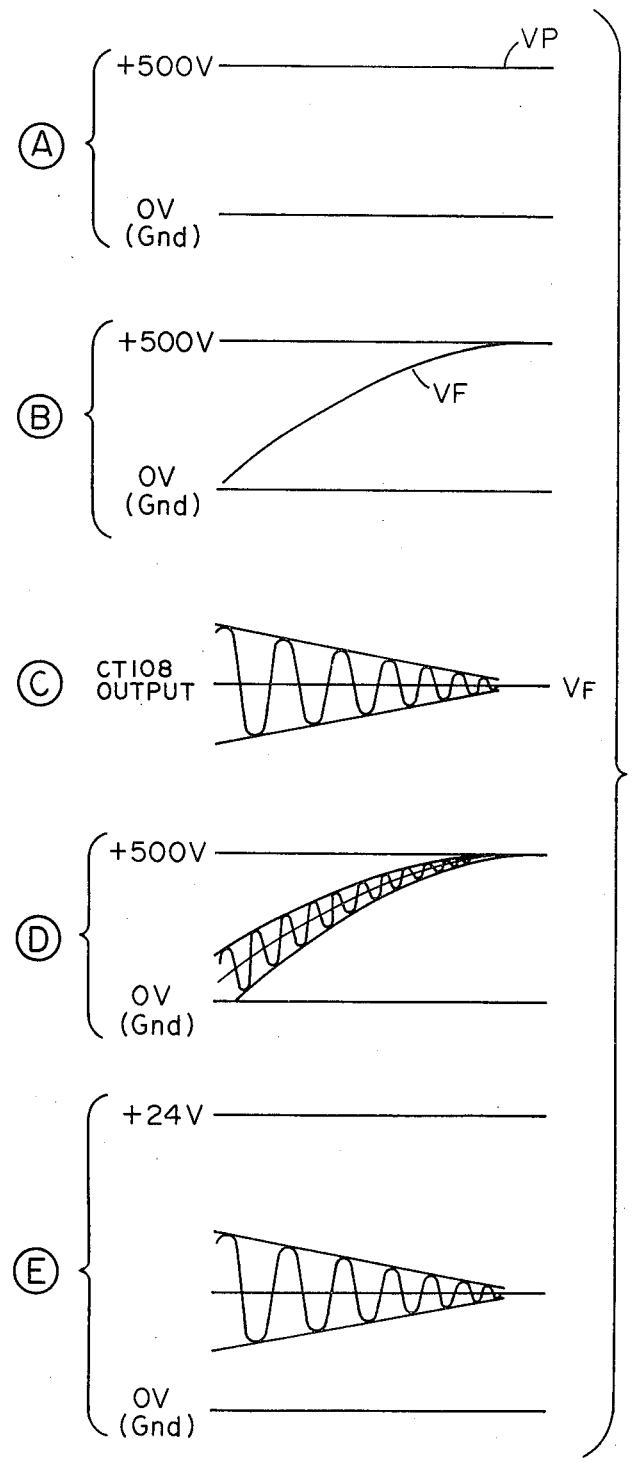
FIG. 26 is waveform charts in various portions in FIG. 23.

Now there will be explained the function of the isolator CT103, while making reference to the waveform chart shown in FIG. 26.

It is now assumed that the surface potential $V_p$ of the drum 47 is equal to $+500$ V as shown in FIG. 26A and that the feedback voltage $V_F$ (shown in FIG. 26B) of the amplifier CT108 initiates from the ground potential. Said feedback voltage $V_F$ varies from ground potential (0V) to 500 V equal to the surface potential $V_p$, as represented in FIG. 26B. With respect to the feedback potential $V_F$, the output voltage from the preamplifier CT102 is an AC signal of an amplitude in the order of several millivolts, proportional to the absolute value of the difference between the potential to be measured $V_p$ and the feedback voltage $V_F$, as shown in FIG. 26C. However with respect to the ground potential, said feedback potential $V_F$ is overlapped with said AC signal, as shown in FIG. 26D. The feedback potential $V_F$ is supplied to the drive-side terminal P115 of the light-emitting diode LED101 of the isolator CT103, while the terminal P113 is connected to a potential of $V_F+24$ V, and the terminal P114 is connected to the output of the amplifier CT101. In this manner the isolator CT103 is an AC signal of an amplitude proportional to the difference between the potential to be measured $V_p$ and the bias potential $V_F$ and the feedback or bias potential $V_F$ of the chopper 103 and the shield member 105. Said AC signal causes, through photocoupling, the change in the emitter current of the phototransistor PTr1, which is controlled in a voltage range of 24–0 V to provide, at the output terminal P117, an AC signal not overlapped with the feedback potential $V_F$, as shown in FIG. 26E.

Figure 28:
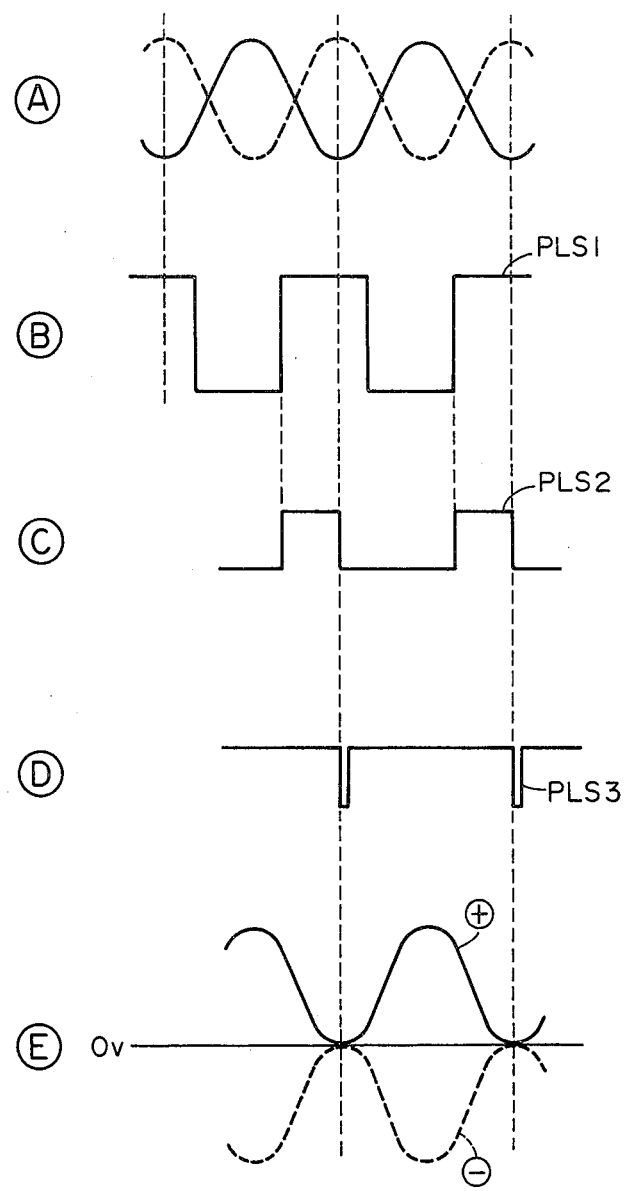
FIG. 28 is a waveform chart showing signals in various portions in FIG. 27.

The output signal from the isolator CT103 is converted into a DC current by the synchronizing clamp circuit and smoothed by an integrating circuit CT107. Now the functions of circuits CT106 and CT107 are explained in conjunction with the waveform chart shown in FIG. 28.

The output signal of the isolator (shown in FIG. 28A) is an AC signal of an amplitude proportional to the difference between the measured potential $V_p$ and the chopper potential (feedback potential) $V_F$ as explained in the foregoing and has a certain phase relationship with the tuning-fork drive pulse signal PLS1 shown in FIG. 28B. In FIG. 28A, the full line and broken line respectively show the case in which the measured potential $V_p$ is positive or negative with respect to the chopper or feedback potential.

A pulse signal PLS2 (shown in FIG. 28C) is obtained by delaying the output pulse PLS1 of the tuning-fork drive circuit by a monostable multivibrator CT104 in such a manner that the leading end thereof is shifted to the timing of the negative peaks in the full-lined signal shown in FIG. 28A. At the trailing end of said pulse PLS2 a monostable multivibrator CT105 is activated to obtain a narrow negative pulse PLS3 (FIG. 28D), which is synchronized with the negative peak of the full-lined signal or with the positive peak of the broken-lined signal of the output signal (FIG. 28A) from the isolator.

Figure 27:
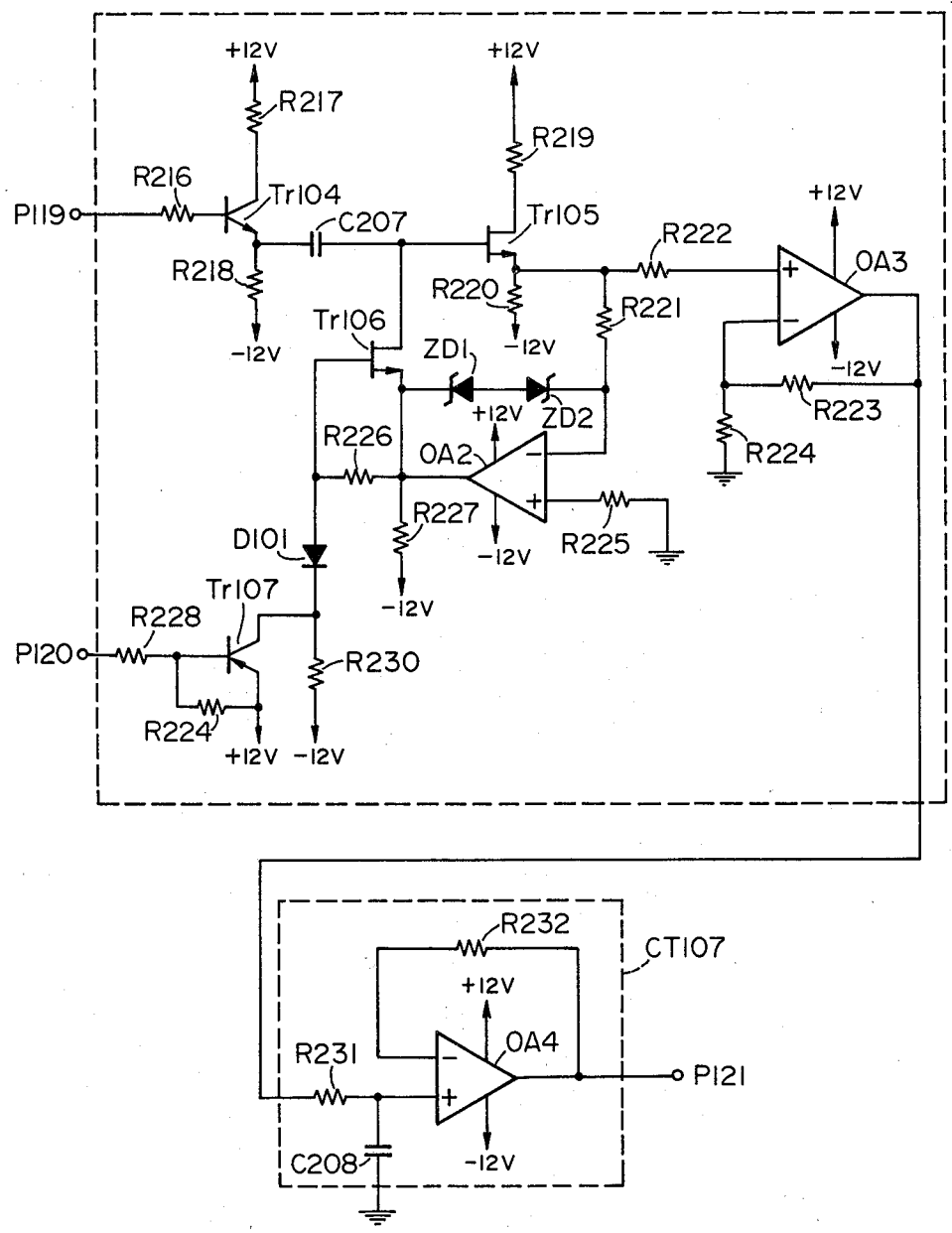
FIG. 27 is a detailed circuit diagram of the integrating circuit CT106 and amplifier CT107.

The output signal from the isolator is supplied to a terminal P119 of a synchronizing clamp circuit CT106 (FIG. 27), and, after current amplification by an emitter follower circuit Tr104, to a condenser C7.

The other terminal of said condenser C7 is connected to the gate of a source follower circuit Tr105 and to the drain of an FET switch Tr106. When said switch is in the "off" state, the gate of Tr105 and the drain of Tr106 show a high impedance to retain the charge in the condenser C207, so that the potential of the condenser terminal connected to the gate of said circuit Tr105 follows the change of potential of the other terminal.

On the other hand the output pulse signal PLS3 from the monostable multivibrator CT105 is supplied to an input terminal P120 of the synchronizing clamp circuit CT106 to render a transistor Tr107 conductive at the timing of negative peaks.

An operational amplifier OA2 is connected to clamping Zener diodes ZD1, ZD2 to limit the output within a range of 0 to ±5 V. Upon conduction of Tr107, the cathode of the diode D101 is biased to +12 V to cut off the same, whereby the bias between the source and gate of the FET switch Tr106 is reduced to zero to allow current conduction therebetween. Then a feedback loop for the operational amplifier OA2 is formed by the FET switch Tr106, source follower circuit Tr105 and a resistor R221 to reduce the potential difference between two input terminal of the operational amplifier OA2 to zero, so that, in consideration of the high input resistance thereof, the source potential of Tr105 is reduced to ground potential while the terminal of the condenser C207 connected to the gate of Tr105 is biased at a potential shifted by the gate-source voltage of Tr105 instead of 0 V.

When the output pulse signal PLS3 of the circuit CT105 is shifted from low-level state to high-level state, the transistor Tr107 is shut off to render the diode D101 conductive, thereby causing a current in resistors R226 and R230, thus applying a high inverse bias to the gate of Tr106 to shut off the same.

When the transistor Tr106 is shut off the potential of the terminal of the condenser C207 connected to the gate of Tr105 shows the same change as that of the other terminal as explained in the foregoing.

Thus, in case the measured potential is positive with respect to the chopper potential, there is obtained at the source a signal of a waveform same as that of the isolator in which the negative peaks are clamped to the ground potential as shown by the full line in FIG. 28E.

Also in case the measured potential is negative with respect to the chopper potential, there is obtained a signal of a waveform same as that of the isolator in which the positive peaks are clamped to the ground potential, as shown by the broken line in FIG. 28E. Said output signal F is amplified by an operational amplifier OA3, then integrated by a resistor R231 and a condenser C208, further current amplified by an operational amplifier OA4 and supplied to a high-voltage amplifier CT108.

Figure 29B:
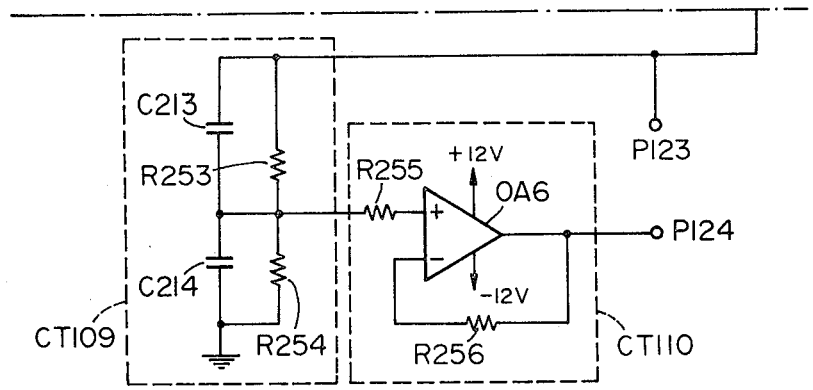

FIG. 29 shows the details of said amplifier CT108 comprising two DC-DC inverters INV1, INV2 and an operational amplifier OA5, wherein the inverter INV2 composed of an inverter transformer T102 and transistors Tr112, Tr113 is structured to provide a fixed output signal of −1 kV at the anode of a high-voltage diode D103.

Also a variable inverter INV1 composed of an inverter transformer T101 and transistors Tr110, TR111 provides an output of 0–2 kV across a condenser C211 and a resistor R246, and a variable output of −1 kV to +1 kV is obtained at the cathode of a diode D102 as the terminal of the low-voltage side of the transformer T101 is connected to the cathode of the diode D103. The output signal from the integrating circuit CT107 is supplied through a terminal P122 to an operational amplifier OA5 which amplifies the difference voltage from a DC potential selected by a variable resistor VR101. The output signal therefrom is supplied through buffer transistors Tr108, Tr109 to a common terminal at the primary side of the inverter transformer T101, whereby the output voltage of the amplifier OA5 is increase by approximately 100 times by the inverter INV1. The variable resistor VR101 performs the offset voltage correction in such a manner that the DC potential applied to the negative input terminal of the amplifier OA5 is nearly equal to the ground potential.

The feedback potential $V_F$ obtained by voltage elevation by the transformer T101 is supplied through a terminal P123 to the chopper 83 and the shield member 81 so that the potential electrometer and the portion to be measured constitute a negative feedback system, in which control is conducted in such a manner that the input potential difference between the chopper or shield potential is made equal to the potential of the area to be measured, thus annulating the difference between the input potential at the terminal P122 and the negative input potential to the amplifier OA5.

As long as the measured potential $V_p$ is in a range from −1 to +1 kV, the feedack potential $V_F$ obtained from CT108 is maintained always equal to said measured potential $V_p$.

Figure 24:
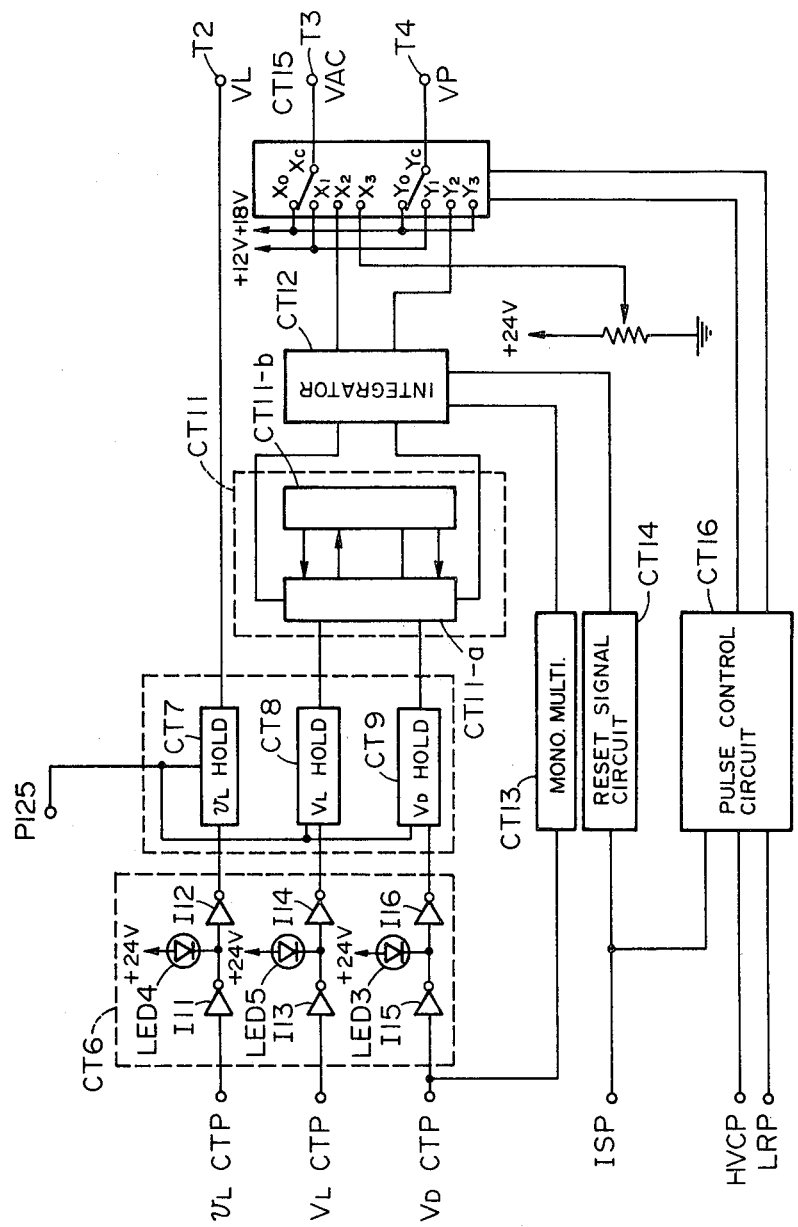
FIG. 24 is a block diagram of a detected voltage processing circuit.

The output signal from the amplifier CT108 is attenuated to 1/100 by an attenuator CT109, then current amplified by a buffer amplifier CT110 and supplied to an output terminal P124, from which a rectified signal is supplied to a terminal P125 shown in FIG. 24.

As said feedback potential $V_F$ supplied to the chopper 103 and shield member 105 is varied so as to constantly annulate the difference from the potential $V_p$ to be measured, the output signal obtained from the terminal P123 is extremely stable and not affected by the offsetting or errors in the circuits CT101 to CT108.

Figure 30:
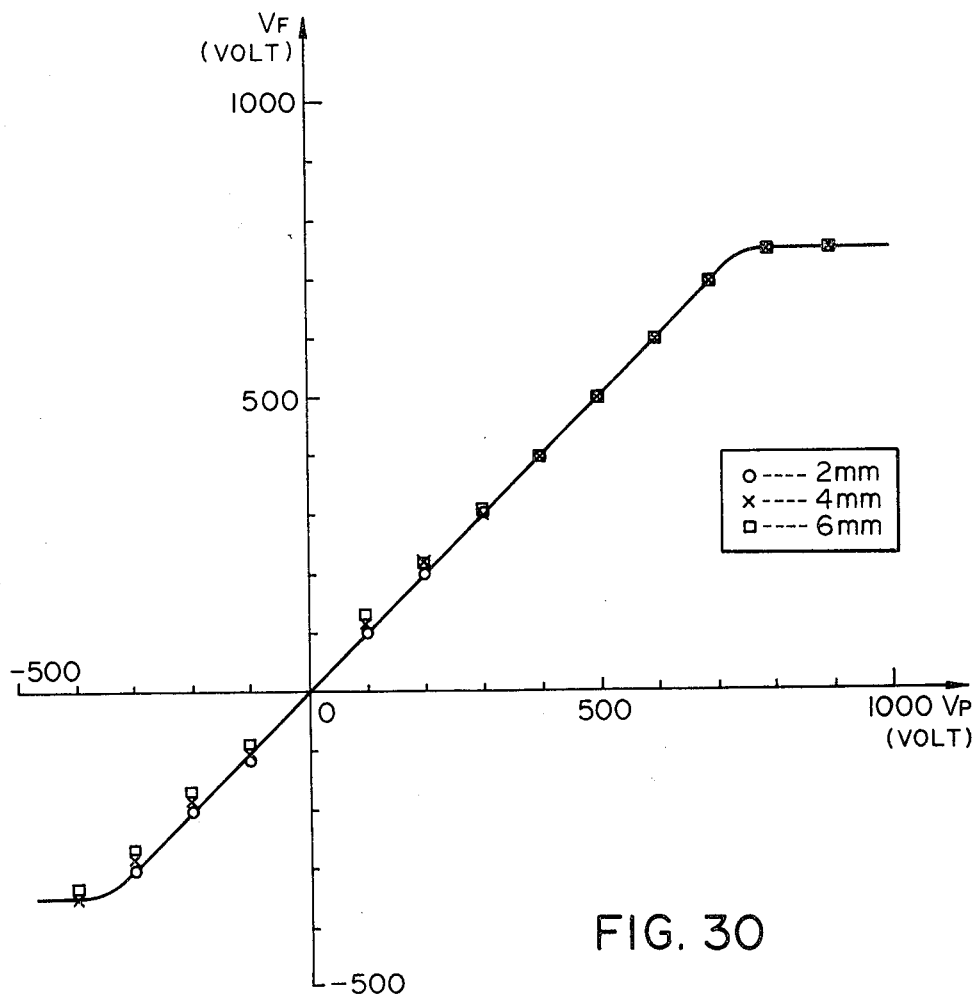
FIG. 30 is a chart showing the relation between the surface potential $V_p$ and the feedback voltage $V_F$.

FIG. 30 shows the relation between the measured potential $V_p$ and the feedback potential $V_F$ in case the distance between said shield member 105 and said drum 47 is selected equal to 2, 4 or 6 mm.

In FIG. 30, the output range of the aforementioned amplifier CT108 is selected as from −350 to +750 V.

As shown in this chart the feedback potential remains substantially constant with respect to the potential $V_p$ to be measured regardless of said distance. This result is presumably due to a fact that the measuring electrode is completely liberated from the effect of the electric field emanating from the drum surface and thus becomes independent from the distance between the electrode and the drum surface when a condition $V_p = V_F$ is reached, namely when the bias potential of the chopper or shield member becomes equal to the surface potential of the drum. Although in the present embodiment there is employed a surface potential electrometer utilizing reciprocating vibration, it is also possible to use a potential electrometer utilizing a rotary sector as disclosed in the U.S. patent application Ser. No. 68,416 filed Aug. 21, 1979.

(5) Detected Potential Processing Circuit

Now reference is made to FIG. 24 showing an example of the detected potential processing circuit, in which the detected voltage supplied from a terminal P125 is supplied to a target light potential ($v_L$) holding circuit CT7, a light potential ($V_L$) holding circuit CT8 and a dark potential ($V_D$) holding circuit CT9.

Said $v_L$ holding circuit CT7 receives a $v_L$ detection pulse signal $v_L$CTP from a DC controller through inverters I11, I12 in a pulse circuit CT6 to hold the input voltage from said terminal P125 in response to said signal $v_L$CTP. Also a light-emitting diode LED4 in said pulse circuit CT6 is lighted upon receipt of said signal $v_L$CTP. Similarly the $V_L$ holding circuit CT8 holds the output voltage from a buffer amplifier CT110 in response to a $V_L$ detection signal $V_L$CTP, and a light-emitting diode LED5 is lighted in response thereto. Also the $V_D$ holding circuit CT9 holds the output voltage of the buffer amplifier CT110 in response to the $V_D$ detection signal $V_D$CTP and a light-emitting diode LED3 is light in response thereto.

A calculating circuit CT11 is provided for executing the calculations explained in the foregoing in relation to the surface potential controlling system, and determines the current differences $\Delta I_{pn}$ and $\Delta I_{ACn}$ between the currents $I_{Pn}$, $I_{ACn}$ supplied to the positive charger and AC charger and the currents $I_{p(n+1)}$, $I_{AC(n+1)}$ to be supplied to said chargers at the succeeding potential measurement, said current differences being represented in the following manner:

$$\Delta I_{Pn} = I_{p(n+1)} - I_{Pn} = \alpha 1 \cdot \Delta V_{Dn} + \alpha 2 \sqrt{\Delta V_{Ln}}$$

$$\Delta I_{ACn} = I_{AC(n+1)} - I_{ACn} = \beta 1 \cdot \Delta V_{Dn} + \beta 2 \cdot \Delta V_{Ln}$$

The calculating circuit CT11 is divided into two sections CT11-a and CT11-b, of which the former amplifies the output signals from the aforementioned holding circuits CT8, CT9 to obtain the light potential $V_{Ln}$ and dark potential $V_{Dn}$ which are supplied to said section CT11-b, while the latter section CT11-b determines:

$$\alpha 1 (V_{Do} - V_{Dn}) \quad (1)$$

$$\alpha 1 (V_{Do} - V_{Dn}) \quad (2)$$

$$\beta 2 (V_{Lo} - V_{Ln}) \quad (3)$$

$$\beta 2 (V_{Lo} - V_{Ln}) \quad (4)$$

and returns these values to the section CT11-a to perform the calculations:

(1)+(3)

(2)+(4)

of which results are supplied to an integrating circuit CT12.

Figure 31:
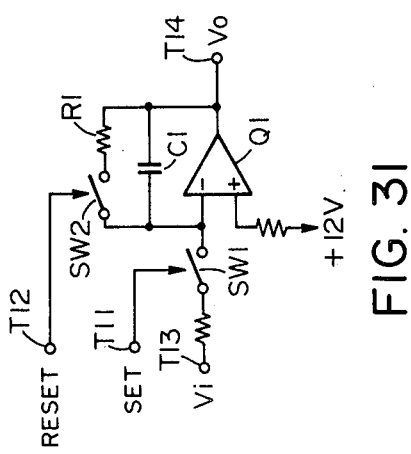
FIG. 31 is a detailed circuit diagram of the integrating circuit CT12.

Said integrating circuit CT12 is provided with two circuits for light and dark potentials, each structured as shown in FIG. 31.

Referring to FIG. 31, terminals T11 and T12 respectively receive a set signal SET and a reset signal RESET, in response to which analog switches SW1, SW2 are respectively closed.

Upon closure of the switch SW1 in response to the set signal SET through the function of the monostable multivibrator CT13 caused by the dark potential detection signal $V_D$CTP, the input potential is supplied to the negative input terminal of an operational amplifier Q1 and simultaneously charges a condenser C1.

Also in the aforementioned state 3 or 4, in response to the initial setting there is released an initial setting signal ISP, which is supplied through a reset signal circuit CT14 to, as said reset signal, the integrating circuit CT12 to close said switch SW2, whereupon the charge accumulated in the condenser C1 is discharged through a resistor R1 to provide a standard potential of 12 V through an output terminal T14. Since the switch SW1 is closed only for a period corresponding to 1/5 of the complete charging-discharging time of the condenser C1, the charging or discharging is conducted over a range corresponding to 1/5 of the difference between the input voltage Vi from the input terminal T13 and the standard voltage 12 V.

As an example, the output voltage $V_{o1}$ in response to the first set-signal SET can be represented as follows in the case wherein the input voltage $V_{i1}$ is equal to 14.5 V:

$$V_{o1} = (12 - V_{i1})/5 + 12 = -2.5/5 + 12 = 11.5 \ (V)$$

In case the input voltage $v_{i2}$ is 9.5 V when the second set signal is generated, the output voltage $V_{o2}$ becomes:

$$V_{o2} = (V_{o1} - V_{i2})/5 + 12 = (11.5 - 9.5)/5 + 12 = 12.4 \ (V)$$

The above-mentioned procedure is repeated according to the number of corrections. Thus, for an output voltage $V_{o(n-1)}$ before the closing of the switch SW1 and for a succeeding input voltage $V_{in}$, the succeeding output voltage can be represented as follows:

$$V_{on} = (V_{on} - V_{in})/5 + 12$$

so that the amount of charging is equal to 1/5 of the amount of change. As explained in the foregoing, the input voltage $V_i$ corresponds to the current difference $\Delta I_{DCn}$ or $\Delta I_{ACn}$, while the output voltage $V_o$ corresponding to the control current $I_{DC(n+1)}$ or $I_{AC(n+1)}$.

A multiplexer circuit CT 15 is controlled in response to the signal from a pulse control circuit CT16.

Said pulse control circuit CT16 supplies said multiplexer circuit CT15 with 2-bit parallel signals which are varied according to the state of the apparatus, i.e. the pre-wetting or stand-by period, initial setting period, controlled rotation or copying operation, and post-rotation after the copying operation.

Said multiplexer circuit CT15 selects the contacts according to the state of the apparatus to provide the control voltage $V_{DC}$ for the primary charger and the control voltage $V_{AC}$ for the AC charger, respectively from output terminal T3, T4.

More specifically the pulse control circuit CT16 controls the state of the contacts $X_c$, $Y_c$ in said multiplexer circuit CT15 according to the state of the initial setting signal ISP, high-voltage control pulse HVCP, and post-rotation pulse LRP in a manner as shown in the following logic table, in which the contacts of the input side are represented by Xn, Yn (n=0, 1, 2, 3):

| Control pulse | | | Contact | |
| --- | --- | --- | --- | --- |
| LPR | ISP | HVCP | $X_c$ | $Y_c$ |
| L | L | L | $X_0$ | $X_0$ |
| L | L | H | $X_2$ | $Y_2$ |
| L | H | L | $X_1$ | $Y_1$ |
| L | H | H | $X_3$ | $Y_3$ |
| H | — | — | $X_3$ | $Y_3$ |

The contents of the input contacts are as follows:

| | |
| --- | --- |
| $X_0$ = +18V | $Y_0$ = +18V |
| $X_1$ = +12V | $Y_1$ = +12V |
| $X_2$ = control signal | $Y_2$ = control signal |
| $X_3$ = +18V | $Y_3$ = post-rotation control signal |

Figure 32:
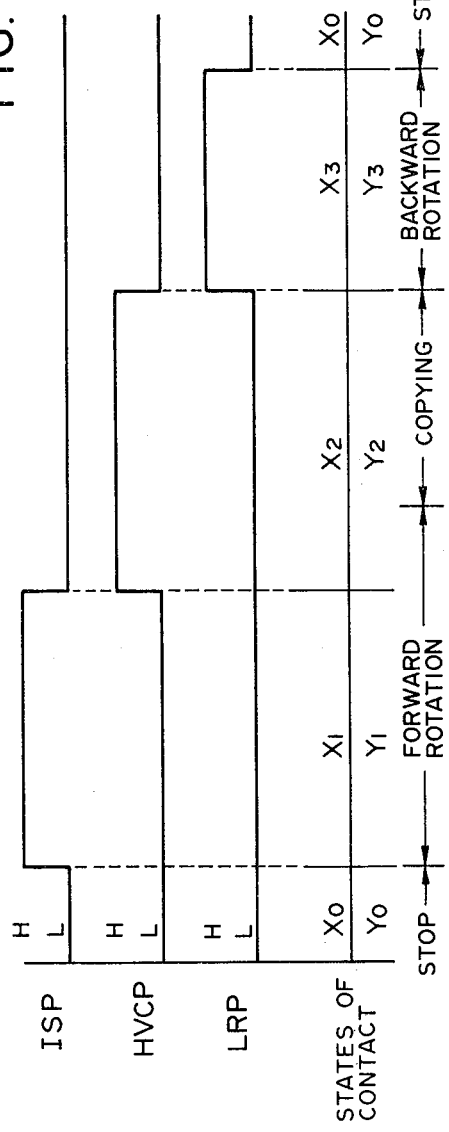
FIG. 32 is a timing chart of control pulses.
Figure 33A:
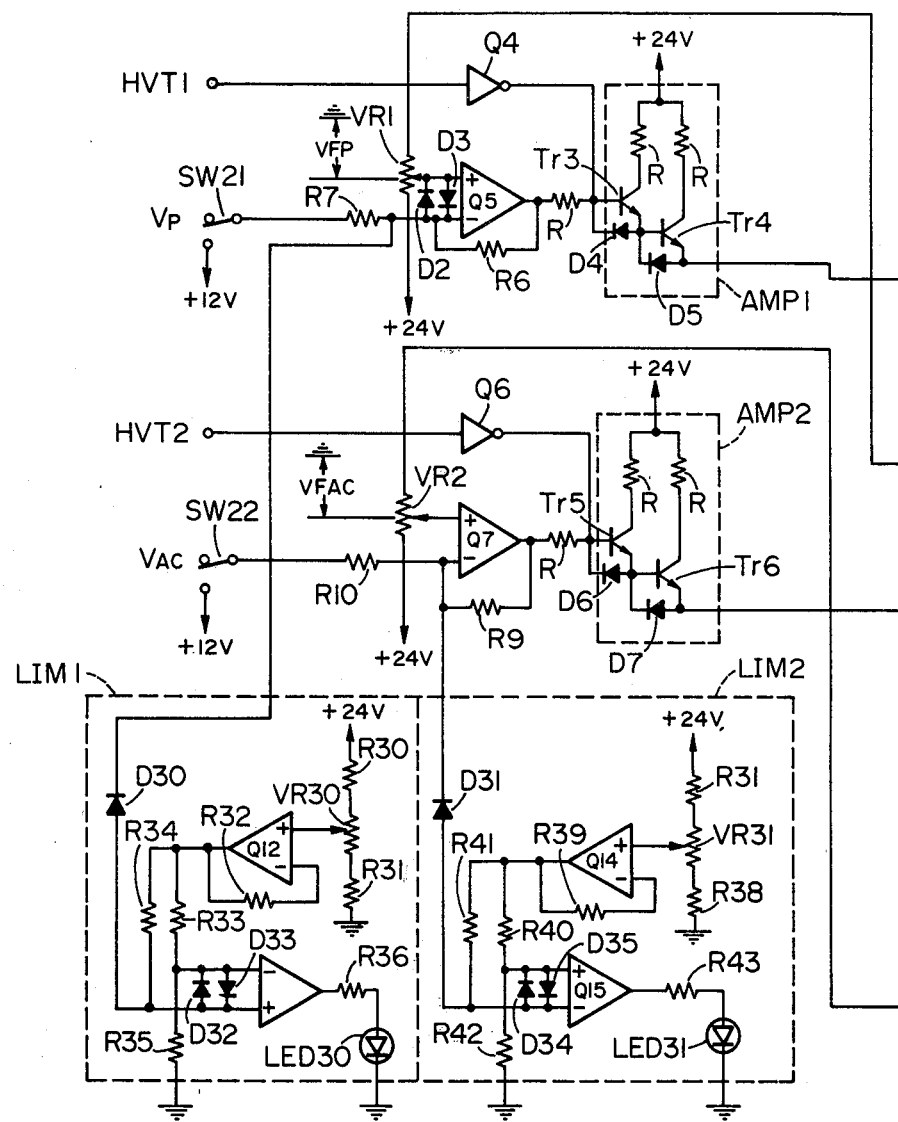
Figure 33B:
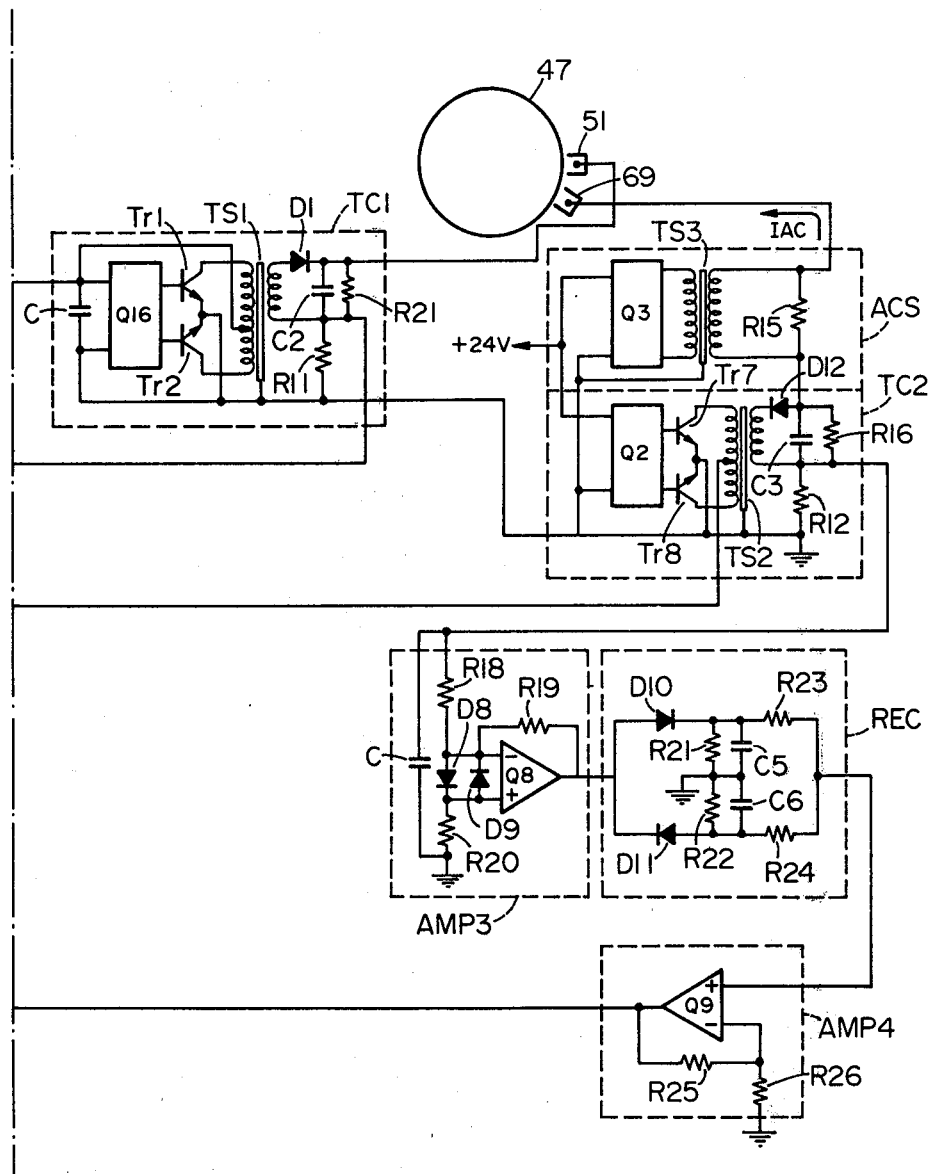

FIG. 32 shows the timing of control pulses. While the copying operation is not in progress, the switches $X_c$, $Y_c$ are respectively connected to the contacts $X_o$, $Y_o$ both of which provide +18 V to deactivate the primary and secondary high-voltage sources. In the former half of the pre-rotation step, the switches $X_c$, $Y_c$ are respectively connected to the contacts $X_1$, $Y_1$ both of which provide +12 V to cause the primary and secondary high-voltage sources to generate standard currents, wherein the drum surface potential is measured by the surface potential electrometer. In the latter part of the pre-rotation step $X_c$ and $Y_c$ are respectively connected to $X_2$, $Y_2$ to which correction signals are supplied, in case the drum surface potential measured in the former part of said pre-rotation step is different from the target surface potential, to cause the high-voltage sources to supply corrected high voltages to the chargers. This state is maintained also in the succeeding copying step. In the post-rotation step $X_c$ and $Y_c$ are respectively connected to $X_3$ and $Y_3$, wherein $X_3$ provides +18 V to terminate the function of the primary charger while $Y_3$ provides the post-rotation control signal to supply a determined corona current to the AC charger for removing the charge remaining on the drum surface.

Figure 33:
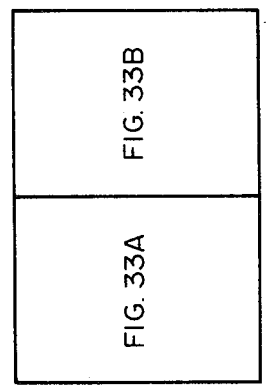

The control voltage $V_{DC}$ for the primary charger and the control voltage $V_{AC}$ for the AC charger supplied from said multiplexer circuit CT15 are supplied to a charging voltage control circuit shown in FIG. 33.

In said circuit the primary charger control voltage $V_p$ is supplied through a resistor $R_7$ to the inverted input terminal of an operational amplifier $Q_5$, which supplies the difference between the voltage $V_{FDC}$ supplied to the non-inverted input terminal from a variable resistor $VR_1$ and the aforementioned correction voltage $V_{DC}$, said difference being multiplied by $-R_6/R_7$. When the primary charger drive signal $HVT_1$ is in the high-level state, the output signal from the operational amplifier $Q_5$ does not turn on a transistor $T_{r3}$ in a Darlington current amplifier AMP$_1$ which thus provides zero output signal. On the other hand when said signal $HVT_1$ is in the low-level state, said transistor $T_{r3}$ is turned on whereby a voltage substantially equal to the output voltage of the operational amplifier $Q_5$ is supplied to the primary high-voltage transformer TC1. An oscillator $Q_1$ in the primary transformer TC1 alternately turns on transistors $T_{r2}$, whereby a transformer $TS_1$ provides a secondary output voltage elevated according to the coil ratio, said output voltage being supplied to the primary charger 51 after rectification by a diode $D_1$. The primary corona current $I_{DC}$ in said primary charger 51 is detected by said resistor $R_{11}$ and supplied through the resistor $VR_1$ to the non-inverted input terminal of the operational amplifier $Q_5$, whereby said corona current $I_{DC}$ is controlled in such a manner that said primary charger control voltage $V_{DC}$ coincides with said voltage $V_{FDC}$. Similarly the AC charger control voltage $V_{AC}$ is supplied through a resistor $R_{13}$ to the inverted input terminal of an operational amplifier $Q_7$, which provides the difference between the voltage $V_{FAC}$ supplied to the non-inverted input terminal from a resistor $VR_2$ and said correction voltage $V_{AC}$, said difference being multiplied by $-R_9/R_{10}$. When the AC charger drive signal $HVT_2$ is in the high-level state, the output signal from the operational amplifier $Q_7$ does not turn on a transistor $T_{r5}$ in a Darlington current amplifier AMP$_2$, which thus provides zero output signal. On the other hand when said signal $HVT_2$ is in the low-level state, said transistor $T_{r5}$ is turned on to provide a voltage substantially equal to the output voltage of the operational amplifier $Q_7$ to the AC high-voltage transformer TC$_2$. An oscillator $Q_2$ in said secondary high-voltage transformer TC$_2$ alternately turns on transistors $T_{r7}$, $T_{r8}$, whereby a transformer TS$_2$ provides a secondary output voltage elevated according to the coil ratio, said secondary output voltage being supplied as a DC output after rectification by a diode D12.

An AC voltage generator ACS generates, by means of an AC oscillator $Q_3$ and a transformer TS$_2$, an AC high voltage which is overlapped with the above-mentioned DC output and supplied to a secondary charger 69. The AC corona current $I_{AC}$ in said AC charger is detected by a resistor $R_{12}$, of which detection output signal is amplified by an amplifier AMP$_3$ and subjected to the detection of the difference between the positive and negative components by a smoothing circuit REC, said difference being amplified by a DC amplifier AMP$_4$. Further, said detection output signal is supplied, after amplification by said amplifier AMP$_4$, through a resistor $VR_2$ to the non-inverted input terminal of the operational amplifier $Q_7$, whereby said AC corona current $I_{AC}$ is controlled in such a manner that said voltage $V_{FAC}$ coincides with said AC correction voltage $V_{AC}$.

As explained in the foregoing, the present embodiment is capable of achieving a constant corona current through compensation of the fluctuation in the charger load resulting from temporary circumferential change or in the power supply to the corona chargers and also capable of compensating the fluctuation in the surface potential resulting for example from the time-dependent deterioration of the drum, since the corona current is maintained constant by means of the detected output of the surface potential and the detected output of the corona current. It is also possible, by actuating the switches $SW_{21}$, $SW_{22}$, to realize a determined input voltage regardless of the control voltages $V_{DC}$, $V_{AC}$. Further, in the present embodiment, there are provided limiter circuits LIM1, LIM2 as output limiting means for preventing accidents. In said limiter circuits an operational amplifier $Q_{14}$ forms a buffer circuit with a resistor $R_{39}$ and receives a voltage divided from the power supply voltage divided by resistors $R_{31}$, $R_{38}$ and a variable resistor $VR_{31}$. The output voltage of said amplifier $Q_{14}$ is regulated, by means of the variable resistor $VR_{31}$, to a value 0.6 V higher than the maximum value $V_{AC}$MAX of the control signal $V_{AC}$ for the AC charger. Said operational amplifier $Q_7$ functions as an inverter to provide a larger output current for a lower AC charger control voltage $V_{AC}$. When said voltage is decreased beyond the minimum value $V_{AC}$MIN' a diode $D_{31}$ is turned on whereby the control signal $V_{AC}$ is supplied through a resistor $R_{10}$ and a low resistor $R_{41}$ to the output of the amplifier $Q_{14}$. When the output voltage of said amplifier $Q_{14}$ is substantially constant and the resistor $R_{41}$ is sufficiently smaller than the resistor $R_{10}$, the high-voltage output current shows no further increase and is limited to this state. When the limiter is in function by the conduction of the diode $D_{31}$, the state of a comparator 15 is inverted to light a light-emitting diode $LED_{31}$, thus confirming the limiter function. The limiter circuit $LIM_1$ for the primary charger functions in the identical manner as said limiter circuit $LIM_2$ for the AC charger. Said limiters are provided in order to avoid excessively high corona currents in the chargers. Said limiters $LIM_1$, $LIM_2$ are put into function in case the target surface potentials are not reached by the determined currents in said primary and AC chargers, as will be encountered particularly when the drum itself is deteriorated. For this reason the light-emitting diodes $LED_{30}$, $LED_{31}$ not only indicate the function of the limiting circuits but also function as the warming lamps for the drum deterioration. Also said chargers will cause glow discharge instead of corona discharge in case the charging electrode is positioned excessively close to the drum surface, or a foreign matter such as paper is present between the charger and the drum surface, or the charging electrode, eventually broken, is brought into contact with the drum surface. The above-explained limiter circuits are effective in preventing excessive current in such cases, which excess may result eventually in the destruction of the drum surface.

Figure 34:
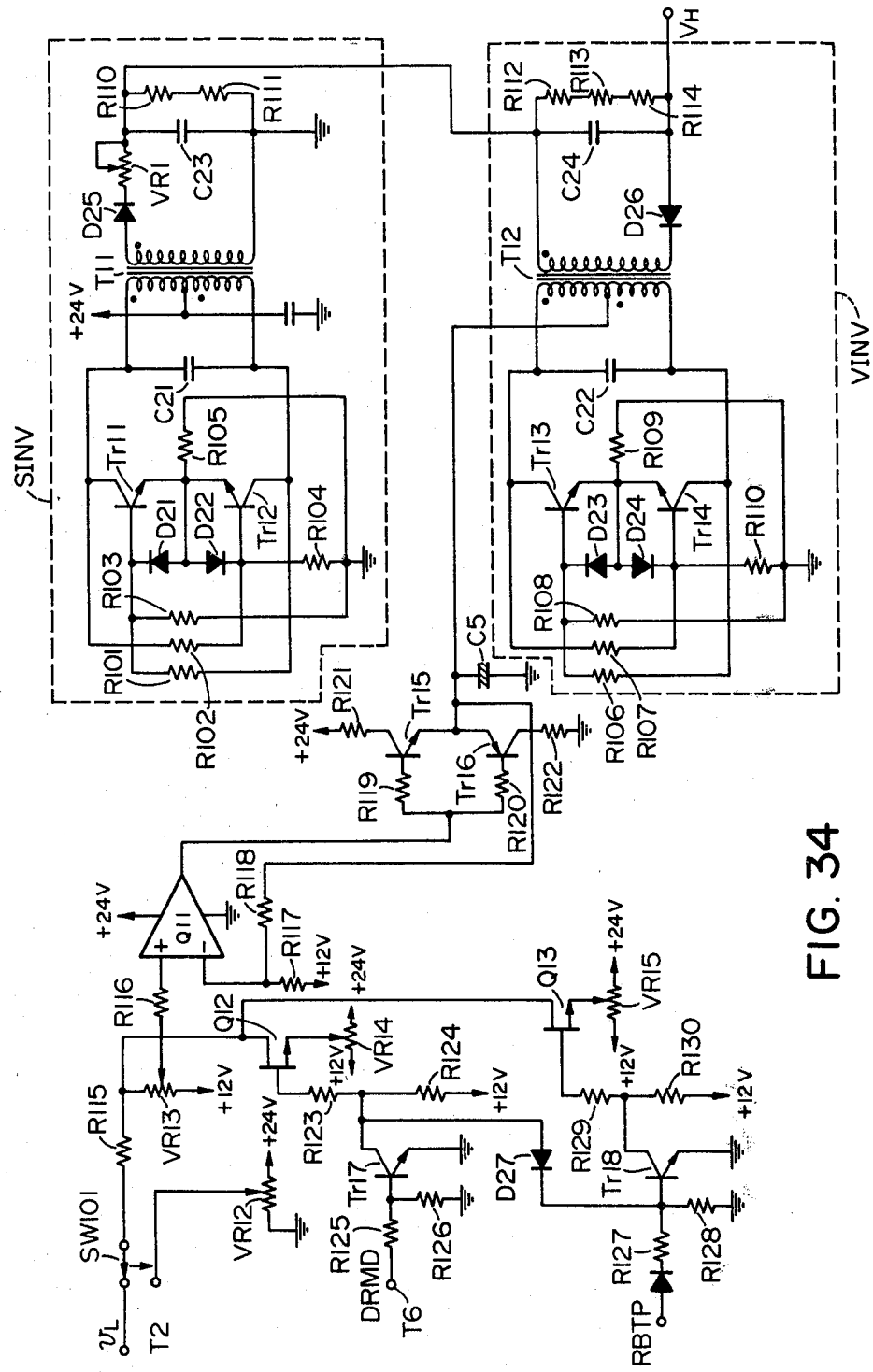
FIG. 34 is a circuit diagram of a developing bias control circuit.

Now there will be explained a circuit for controlling the developing roller bias voltage $V_H$ shown in FIG. 34.

In said circuit a terminal $T_2$ receives the output signal from the aforementioned $v_L$ holding circuit $CT_7$ while a terminal $T_6$ receives a main motor drive signal DRMD indicating the drum rotation, and a terminal $T_7$ receives a roller bias control signal RBTP generated during the development of a latent image corresponding to the original. During the drum rotation and the latent image development said signals DRMD and RBTP and both in the high-level state whereby the transistor $T_{r17}$, $T_{r18}$ are both turned on to reduce the gate of a depression type junction FET $Q_{12}$ and $Q_{13}$ to 0 V, thus turning off said FET's. Consequently an operational amplifier $Q_{11}$ receives said output voltage $V_L$ through a resistor $R_{105}$ and a variable resistor $VR_{13}$. The output signal from said amplifier $Q_{11}$ is supplied, through a current booster composed of transistors $T_{r15}$, $T_{r16}$, to a determined point in the primary coil of a transformer $T_{12}$, whereby the developing bias voltage $V_H$ is rendered variable, by inverter circuits VINV, SINV according to said output voltage $V_L$. In this state the developing bias voltage $V_H$ is controlled by said inverters SINV, VINV so as to be higher by 50 V than the standard light potential on the drum. Also in case the drum is in rotation but the development of the latent image is not conducted, the signal DRMD is in the high-level state while the signal RBTP is in the low-level state to turn on the transistor $T_{r17}$ and to turn off the transistor $T_{r18}$, whereby said FET $Q_{12}$ is turned off while said FET $Q_{13}$ is turned on. Upon turning on of FET $Q_{13}$ the operational amplifier $Q_{11}$ receives a determined voltage determined by a variable resistor $VR_{15}$, whereby the transformer $T_{12}$ receives a determined voltage corresponding to the above-mentioned determined voltage, through the aforementioned current booster. In this case said voltage determined by the variable resistor $VR_{15}$ is so selected that the bias voltage becomes equal to $-75$ V, thus preventing the toner deposition on the drum during this state. Also in case the drum is not in rotation, the signals DRMD, RBTP are both in the low-level state. In this case the transistor $T_{r17}$ is turned off while the transistor $T_{r18}$ is turned on through a diode $D_{27}$, whereby said FET $Q_{12}$ is turned on while $Q_{13}$ is turned off. Upon turning of the FET $Q_{12}$, the operational amplifier $Q_{11}$ receives a voltage determined by a variable resistor $VR_{14}$, whereby the transformer $T_{12}$ receives a fixed voltage corresponding to said determined voltage through said current booster.

In this case the voltage determined by the variable resistor $VR_{14}$ is so selected as to reduce the developing bias voltage $V_H$ to 0 V, thus preventing the precipitation of the charged liquid developer while the drum is not rotated.

As explained in the foregoing, it is rendered possible to achieve stabler development by varying the developing roller bias voltage $V_H$ according to the control state of the apparatus and controlling said voltage according to the detected surface potential during the development of the latent image.

In the following there will be explained is the function of an inverter transformer circuit SINV for providing a fixed voltage output (hereinafter called static inverter) and of an inverter transformer circuit VINV for providing a variable output.

In the stationary inverter circuit SINV, upon power supply to a tap in the primary coil of the transformer T11, either transistor Tr11 or Tr12 is turned on. In case the transistor Tr11 is turned on, the collector current thereof increases to generate an inverse electromotive force in the coil connected to the collector of the transistor Tr12 corresponding to said increase of the collector current, thereby bringing the base of the transistor Tr11 to a positive potential. Thus said collector current of the transistor Tr11 is further increased. In this manner the transistor Tr11 receives a positive feedback and is saturated by a time constant determined by resistors R103, R104 and the inductance of the transformer Tr11. When the collector current of said transistor Tr11 becomes saturated, the inverse electromotive force in the primary coil of the transformer T11 is reduced to zero whereby the transistor Tr11 is turned off to reduce the collector current. Thus an inverse electromotive force is generated in the primary coil of the transformer T11 corresponding to the decrease of said collector current, thus turning on the transistor Tr12. In this manner the transistors Tr11, Tr12 are alternatively turned on and off. Didodes D21, D22 are provided for protecting the bases of the transistors Tr11, Tr12.

Resistance R105 is inserted for preventing the fluctuation in the collector current resulting from the fluctuation in hFE of the transistors Tr11, Tr12, thus maintaining an oscillation duty ratio of 1:1. The amplitude of the voltage induced in the primary coil of the transformer T11 is approximately equal to twice the voltage applied to the center tap of the transformer T11. The voltage induced in the primary coil is elevated to a value determined by the coil ratio, then rectified and smoothed by a diode D25 and a condenser C23 to obtain a DC high voltage.

The variable inverter circuit VINV functions in a similar manner except that the voltage supplied to the center tap of the transformer T12 is varied in response to the input voltage, whereby the output voltage of said transformer T12 is rendered variable according to the input voltage.

Figure 35:
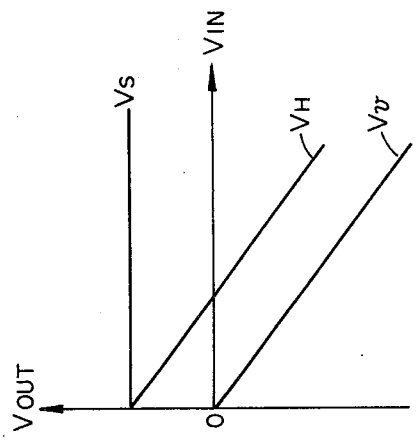
FIG. 35 is a waveform chart showing the high output voltage.

FIG. 35 shows the high output voltage $V_{out}$ as an ordinate as a function of the input voltage $V_{in}$ supplied to the center tap of said transformer T12. Thus, the output voltage $V_s$ from said stationary inverter circuit SINV is constant regardless of said input voltage $V_{in}$ while the output voltage $V_v$ of said variable inverter circuit shows a linear change with respect to the input voltage $V_{in}$. Consequently the actual developing bias voltage $V_H$ obtained by overlapping said output voltages $V_s$ and $V_v$ shows a linear change from a negative value to a positive value.

As detailedly explained in the foregoing, the detected potential in the present invention is not affected by the distance between the measuring electrode and the recording member to be measured, since a voltage equal to the potential of the latent image is supplied to the shield means for intersecting the electric field between said measuring electrode and the recording member.

Consequently it is rendered possible, by means of said detected potential, to achieve extremely precise control on the image forming conditions, such as the developing bias voltage, charging voltage etc., of the process means for image formation. The detection and control of the potential can be stably achieved even if the apparatus is subjected to vibration during the image formation and are not affected by the mounting precision of the potential electrometer.

Although the present invention has been explained in combination with an electrophotographic process utilizing an exposure step combined with simultaneous charge elimination, it is also applicable to an apparatus employing a xerographic process or an electrofax process. Also the recording member is not limited to a photosensitive member but also includes an insulating member.

What I claim is:

1. An image forming apparatus, comprising:
   a recording member;
   means for forming an electrostatic latent image on said recording member;
   means for developing said electrostatic latent image;
   detecting means for detecting the surface potential of said recording member;
   control means for controlling said latent image forming means or developing means in response to the output from said detecting means;
   support means for supporting said recording member and said surface potential detecting means; and
   connecting means for electrically connecting said detecting means and said control means, said connecting means being removably mounted on said support means, and the electrical connection between said detecting means and said control means being made or broken according to whether said detecting means is attached to or detached from said supporting means.

2. An image forming apparatus according to claim 1, wherein said recording member is a rotary member, and said apparatus further comprises a rail member for supporting said detecting means at a determined position in the vicinity of said rotary member, said rail member being in sliding engagement with said detecting means.

3. A surface potential electrometer, comprising:
   a measuring electrode on which is induced a voltage corresponding to the surface potential of a member to be measured;
   chopping means for intermittently interrupting the electric field between said measuring electrode and said member to be measured for detecting said surface potential by said measuring electrode as an AC signal;
   a conductive member for shielding said measuring electrode from the electric field emanating from said member to be measured; and
   regenerating means coupled between said electrode and said conductive member for converting said AC signal into a DC signal, and for supplying said DC signal to said conductive member thereby enabling the detection of the surface potential without the effect of change in the distance between said member to be measured and said electrode.

4. A surface potential electrometer according to the claim 3, wherein said chopping means is positioned between said measuring electrode and said member to be measured.

5. A surface potential electrometer according to the claim 3, wherein said chopping means and said conductive member are integrally structured.

6. A surface potential electrometer according to the claim 3, wherein said conductive member is a shield case encasing said measuring electrode therein.

7. A surface potential electrometer according to the claim 4, wherein said chopping means is composed of a conductive material, and said conductive member is positioned between said chopping means and said member to be measured.

8. A surface potential electrometer according to the claim 7, wherein said conductive member is provided with an aperture for measurement.

9. A surface potential electrometer according to the claim 8, wherein the output voltage of said regenerating means is supplied both to said conductive member and to said chopping means.

10. A surface potential electrometer according to the claim 6, wherein said measuring electrode is mounted on said chopping means, and said conductive member is provided with an aperture for measurement.

11. A surface potential electrometer according to the claim 3, wherein said regenerating means is provided with a negative feedback circuit for supplying said conductive member with a potential equal to the surface potential of said member to be measured.

12. A surface potential electrometer according to the claim 3, further comprising a drive circuit for driving said chopping means, said drive circuit being powered by a float power source which receives the output voltage of said regenerating means as a power supply voltage thereto.

13. A surface potential electrometer according to the claim 6, further comprising in said shield case a circuit for converting the AC signal induced on said measuring electrode into a low-impedance signal, said converting circuit being powered by a float power source receiving the output voltage of said regenerating means as a power supply voltage thereto.

14. An image forming apparatus comprising a surface potential electrometer according to one of the claims 3 to 13 for measuring the surface potential of a recording member, wherein the latent image forming means is controlled by the detection output of said electrometer.

15. A surface potential electrometer comprising:
a measuring electrode on which a voltage is induced corresponding to the surface potential of a member to be measured;
a mechanism for causing said electrode to respond intermittently to the electric field from said member to be measured;
a driving circuit for driving said mechanism so that said electrode detects the surface potential of said member as an AC signal;
a conductive member for shielding said electrode from the electric field emanating from said member to be measured;
a AC-DC converter for converting said AC signal signal into a DC voltage substantially equal to the surface potential of said member;
means for applying the output voltage of said converter to said conductive member; and
a voltage source having a reference output voltage which varies in accordance with the variation of the surface potential of said member to be measured.

16. A surface potential electrometer according to claim 15 wherein said mechanism includes a chopper for interrupting the electric field between said measuring electrode and said member to be measured.

17. A surface potential electrometer according to claim 16 wherein said driving circuit drives said chopper.

18. A surface potential electrometer according to claim 15 wherein said conductive member is a shield case encasing said measuring electrode therein.

19. A surface potential electrometer according to claim 18 wherein said conductive member is provided with an aperture for measurement.

20. A surface potential electrometer according to claim 15 wherein said mechanism comprises a member on which said measuring electrode is disposed, and a driving mechanism for driving said member.

21. A surface potential electrometer according to claim 20 wherein said driving circuit drives said driving mechanism.

22. A surface potential electrometer according to claim 16 wherein said chopper is disposed between said measuring electrode and said member to be measured.

23. A surface potential electrometer according to claim 22 wherein said chopper reciprocates.

24. A surface potential electrometer according to claim 23 wherein said chopper is driven by a piezoelectric element.

25. A surface potential electrometer according to claim 23 wherein said chopper is driven by an electromagnetic coil.

26. A surface potential electrometer according to claim 23 wherein said driving circuit is adapted to cause vibration of said chopper at a proper resonance frequency thereof.

27. A surface potential electrometer according to claim 23 wherein said chopper is of a branched type.

28. A surface potential electrometer according to claim 27 wherein said branched type chopper is provided on one arm thereof with a chopping electrode.

29. A surface potential electrometer according to claim 16 wherein the output of said converter is supplied both to said conductive member and said chopper.

30. A surface potential electrometer according to claim 15 further comprising a pre-amplifier circuit for amplifying said AC signal, and means for coupling said pre-amplifier circuit with said AC-DC converter wherein their reference voltages are different from each other.

31. A surface potential electrometer according to claim 30 wherein the output voltage of said pre-amplifier is coupled with the input of said AC-DC converter.

32. A surface potential electrometer according to claim 30 wherein said coupling means is a photo-coupling member.

33. A surface potential electrometer comprising:
a measuring electrode on which a voltage is induced corresponding to the surface potential of a member to be measured;
a mechanism for causing said electrode to respond intermittently to the electric field from said member to be measured;
a driving circuit for driving said mechanism so that said electrode detects the surface potential of said member as an AC signal;
a conductive member for shielding said electrode from the electric field emanating from said member to be measured;
a pre-amplifier circuit for amplifying said AC signal;
a regenerating circuit for converting the output signal of said pre-amplifier circuit into a DC voltage substantially equal to the surface potential to be measured;
means for applying the output voltage of said regenerating means to said conductive member;
means for coupling said pre-amplifier with said regenerating circuit for providing reference potentials thereto which are different from each other;
means for coupling the reference potential of said pre-amplifier circuit with the input of said regenerating circuit; and
means defining the reference potential of said regenerating circuit as a measuring reference potential of the surface potential of the member to be measured.

34. A surface potential electrometer according to claim 33 wherein said mechanism includes a chopper, for interrupting the electric field, between said measuring electrode and said member to be measured.

35. A surface potential electrometer according to claim 34 wherein said driving circuit drives said chopper.

36. A surface potential electrometer according to claim 33 wherein said conductive member is a shield case encasing said measuring electrode therein.

37. A surface potential electrometer according to claim 36 wherein said conductive member is provided with an aperture for measurement.

38. A surface potential electrometer according to claim 33 wherein said mechanism comprises a member on which said measuring electrode is disposed, and a driving mechanism for driving said member.

39. A surface potential electrometer according to claim 38 wherein said driving circuit drives said driving mechanism.

40. A surface potential electrometer according to claim 34 wherein said chopper is disposed between said measuring electrode and said member to be measured.

41. A surface potential electrometer according to claim 40 wherein said chopper reciprocates.

42. A surface potential electrometer according to claim 40 wherein said chopper is driven by a piezoelectric element.

43. A surface potential electrometer according to claim 41 wherein said chopper is driven by an electromagnetic coil.

44. A surface potential electrometer according to claim 41 wherein said driving circuit is adapted to cause vibration of said chopper at a proper resonance frequency thereof.

45. A surface potential electrometer according to claim 41 wherein said chopper is of a branched type.

46. A surface potential electrometer according to claim 45 wherein said branched type chopper is provided on one arm thereof with a chopping electrode.

47. A surface potential electrometer according to claim 34 wherein the output of said converter is supplied both to said conductive member and said chopper.

48. A surface potential electrometer according to claim 34 wherein said coupling means is a photo-coupling member.

49. A surface potential electrometer according to claim 34 further comprising coupling means for coupling an output voltage from said driving circuit with the input of said regenerating circuit.

50. An image forming apparatus comprising:
process means for forming an electrostatic latent image on a recording member and for developing said latent image;
a measuring electrode on which a voltage is induced corresponding to the surface potential of a member to be measured;
a mechanism for causing said electrode to respond intermittently to the electric field from said member to be measured;
a driving circuit for driving said mechanism so that said electrode detects the surface potential of said member as an AC signal;
a conductive member for shielding said electrode from the electric field emanating from said member to be measured, and for housing said electrode;
a AC-DC converter for converting said AC signal signal into a DC voltage substantially equal to the surface potential of said member;
means for applying the output voltage of said converter to said conductive member; and
a voltage source having a reference output voltage which varies in accordance with the variation of the surface potential of said member to be measured.

51. An image forming apparatus according to claim 50 further comprising control means for controlling the image forming conditions of said process means in response to the output voltage of said converting circuit.

52. An image forming apparatus according to claim 51, wherein said process means comprises charging means and said control means controls the output of said charging means.

53. An image forming apparatus according to claim 52 wherein said recording member is composed of a photosensitive member, and said charging means comprises first charging means for uniformly charging said photosensitive member and second charging means for imagewise charge elimination of said photosensitive member.

54. An image forming apparatus according to claim 52 wherein said process means includes developing means for rendering said latent image visible, and said control means controls the developing bias voltage of said developing means.

55. An image forming apparatus comprising:
process means for forming an electrostatic latent image on a recording member and for developing said latent image;
a measuring electrode on which a voltage is induced corresponding to the surface potential of a member to be measured;
a mechanism for causing said electrode to respond intermittently to the electric field from said member to be measured;
a driving circuit for driving said mechanism so that said electrode detects the surface potential of said member as an AC signal;
a pre-amplifier circuit for amplifying said AC signal;
a regenerating circuit for converting the output signal of said pre-amplifier circuit into a DC voltage signal;
a conductive member for shielding said electrode from the electric field emanating from said member to be measured, and for housing said electrode and said pre-amplifier circuit;
means for applying the output voltage of said regenerating means to said conductive housing;
means for coupling said pre-amplifier with said regenerating circuit for providing reference potentials thereto which are different from each other;
means for coupling the reference potential of said pre-amplifier circuit with the input of said regenerating circuit; and
means for defining the reference potential of said regenerating circuit as a ground potential.

56. An image forming apparatus according to claim 55 further comprising control means for controlling the image forming conditions of said process means in response to the output voltage of said converting circuit.

57. An image forming apparatus according to claim 56, wherein said process means comprises charging means and said control means controls the output of said charging means.

58. An image forming apparatus according to the claim 52 wherein said recording member is composed of a photosensitive member, and said charging means comprises first charging means for uniformly charging said photosensitive member and second charging means for imagewise charge elimination of said photosensitive member.

59. An image forming apparatus according to claim 57 wherein said process means includes developing means for rendering said latent image visible, and said control means controls the developing bias voltage of said developing means.

* * * * *